United States Patent
Sakuma et al.

(10) Patent No.: US 8,710,580 B2
(45) Date of Patent: Apr. 29, 2014

(54) SEMICONDUCTOR DEVICE AND METHOD OF MANUFACTURING THE SAME

(71) Applicants: Kiwamu Sakuma, Yokohama (JP); Haruka Kusai, Yokohama (JP); Shosuke Fujii, Fujisawa (JP); Li Zhang, Fuchu (JP); Masahiro Kiyotoshi, Yokkaichi (JP); Masao Shingu, Yokkaichi (JP)

(72) Inventors: Kiwamu Sakuma, Yokohama (JP); Haruka Kusai, Yokohama (JP); Shosuke Fujii, Fujisawa (JP); Li Zhang, Fuchu (JP); Masahiro Kiyotoshi, Yokkaichi (JP); Masao Shingu, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/689,026

(22) Filed: Nov. 29, 2012

(65) Prior Publication Data

US 2013/0134372 A1    May 30, 2013

(30) Foreign Application Priority Data

Nov. 29, 2011  (JP) .................................. 2011-260667

(51) Int. Cl.
 *H01L 45/00* (2006.01)
 *H01L 27/115* (2006.01)
 *H01L 21/265* (2006.01)

(52) U.S. Cl.
 CPC ....... *H01L 27/1157* (2013.01); *H01L 27/11578* (2013.01)
 USPC ....................................... 257/324

(58) Field of Classification Search
 CPC ..................... H01L 27/11568; H01L 27/1157; H01L 27/11578; H01L 27/115; H01L 27/11551

USPC .............................. 257/324, 325; 365/185.17
See application file for complete search history.

(56) References Cited

U.S. PATENT DOCUMENTS

| | | | |
|---|---|---|---|
| 7,352,018 B2 | 4/2008 | Specht et al. | |
| 2008/0259687 A1 | 10/2008 | Specht et al. | |
| 2009/0309152 A1* | 12/2009 | Knoefler et al. | 257/324 |
| 2012/0139030 A1 | 6/2012 | Sakuma et al. | |

FOREIGN PATENT DOCUMENTS

JP    2006-155750    6/2006

OTHER PUBLICATIONS

U.S. Appl. No. 13/622,644, filed Sep. 19, 2012, Shosuke Fujii, et al.
Wonjoo Kim, et al., "Multi-Layered Vertical Gate NAND Flash Overcoming Stacking Limit for Terabit Density Storage", 2009 Symposium on VLSI Technology Digest of Technical Papers, 2009, 2 pages.

* cited by examiner

*Primary Examiner* — Tom Thomas
*Assistant Examiner* — John Bodnar
(74) *Attorney, Agent, or Firm* — Oblon, Spivak, McClelland, Maier & Neustadt, L.L.P.

(57) ABSTRACT

According to one embodiment, a semiconductor device includes first to n-th semiconductor layers (n is a natural number equal to or more than 2) being stacked in order from a surface of an insulating layer in a first direction perpendicular to the surface of the insulating layer, the first to n-th semiconductor layers extending in a second direction parallel to the surface of the insulating layer, the first to n-th semiconductor layers being insulated from each other, a common electrode connected to the first to n-th semiconductor layers in a first end of the second direction thereof, and a layer select transistor which uses the first to n-th semiconductor layers as channels and which selects one of the first to n-th semiconductor layers.

18 Claims, 28 Drawing Sheets

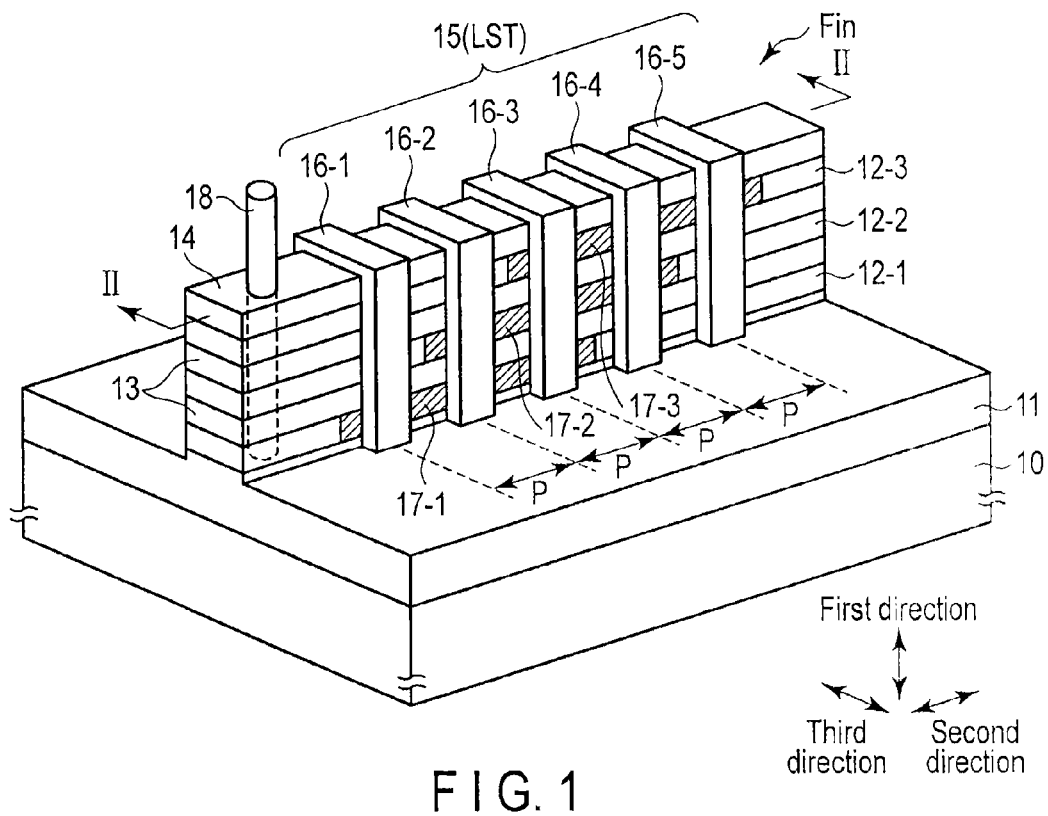
F I G. 1
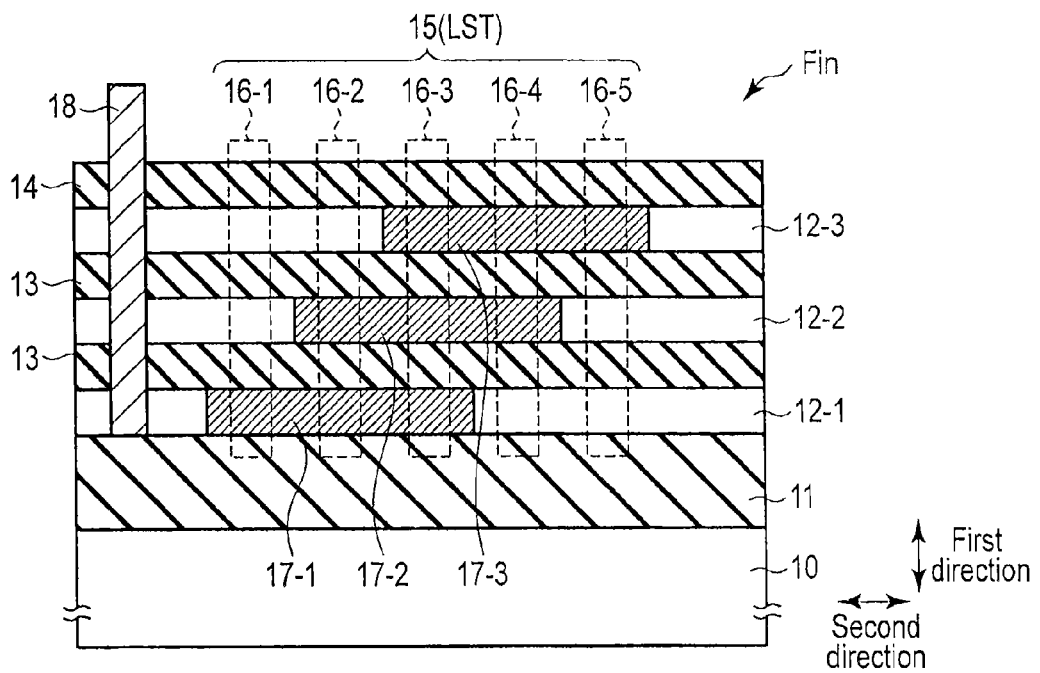
F I G. 2

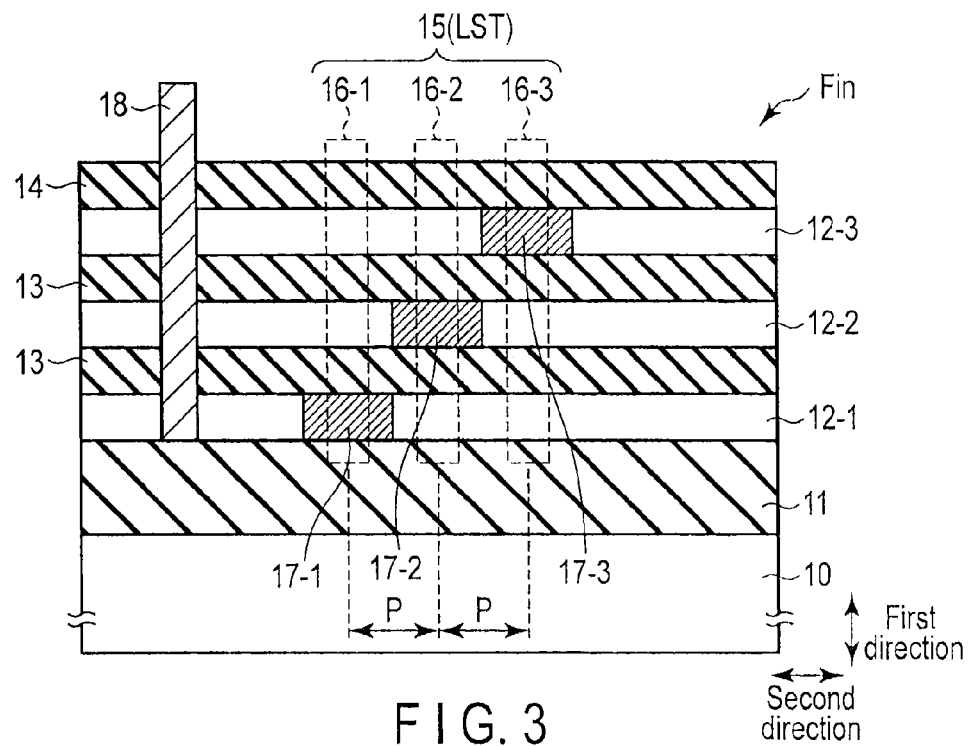
F I G. 3
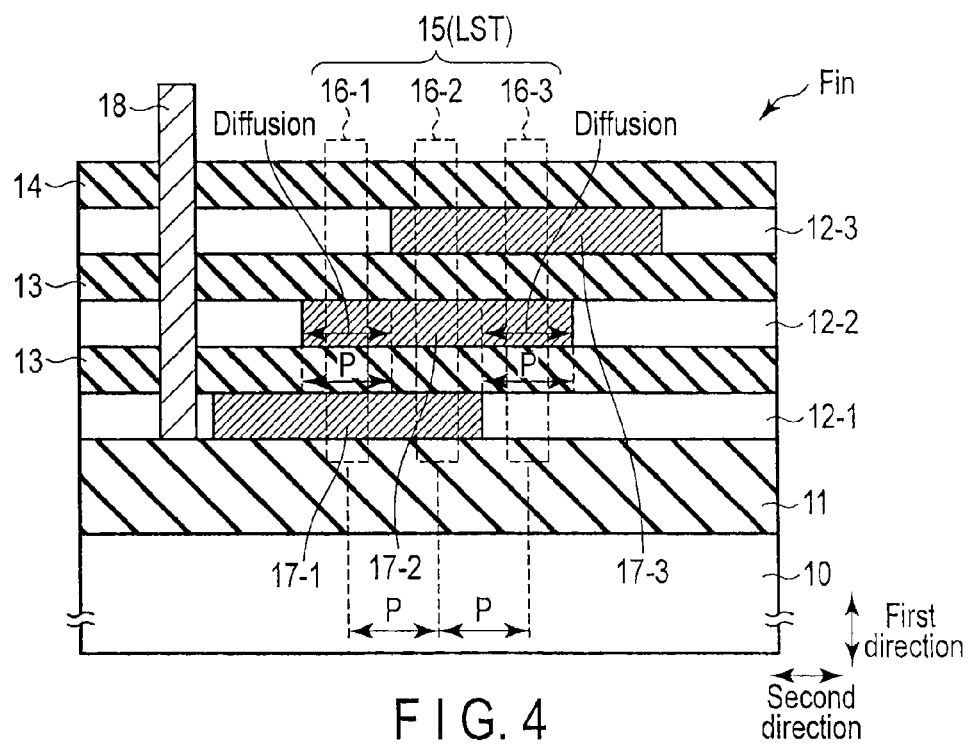
F I G. 4

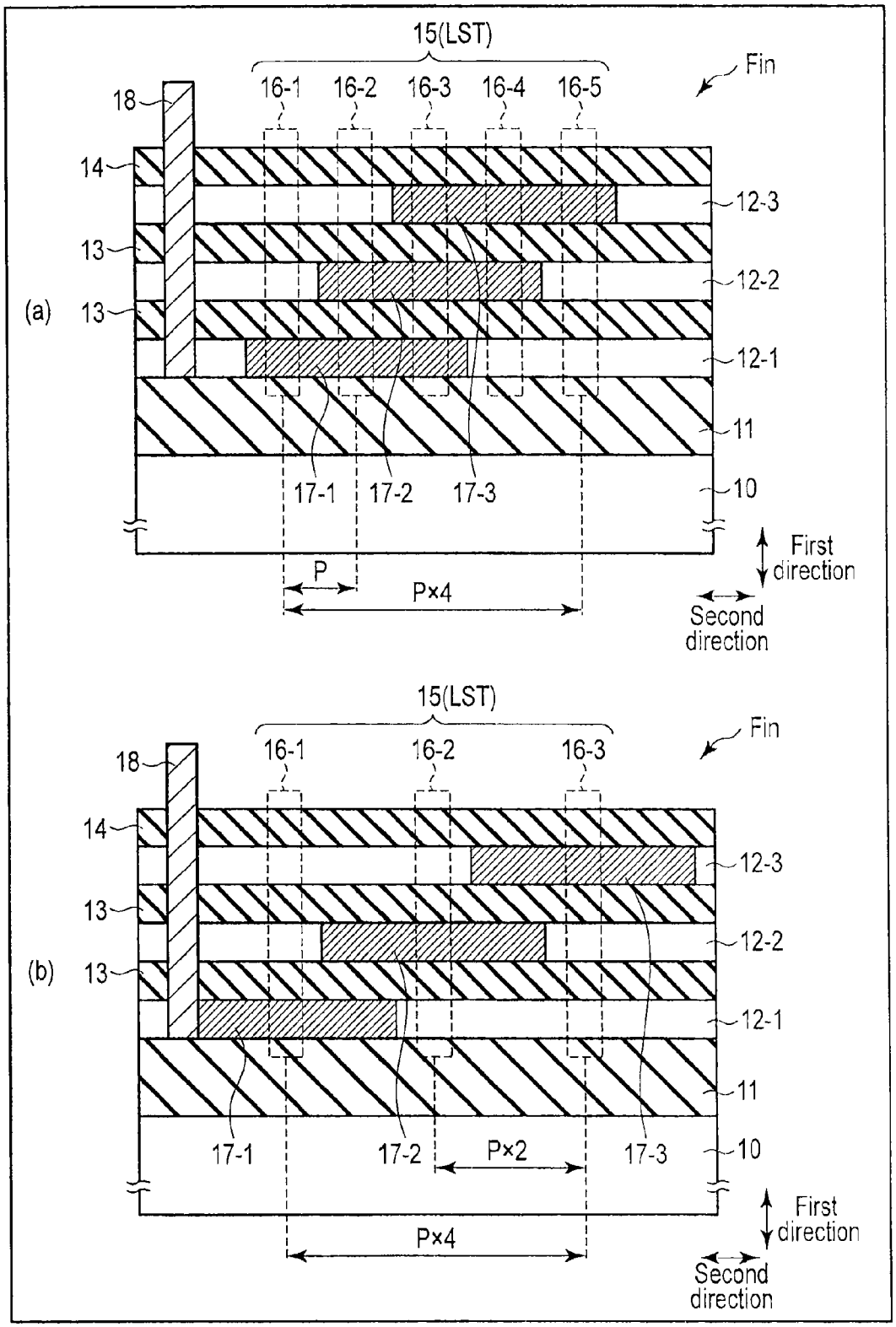
F I G. 5

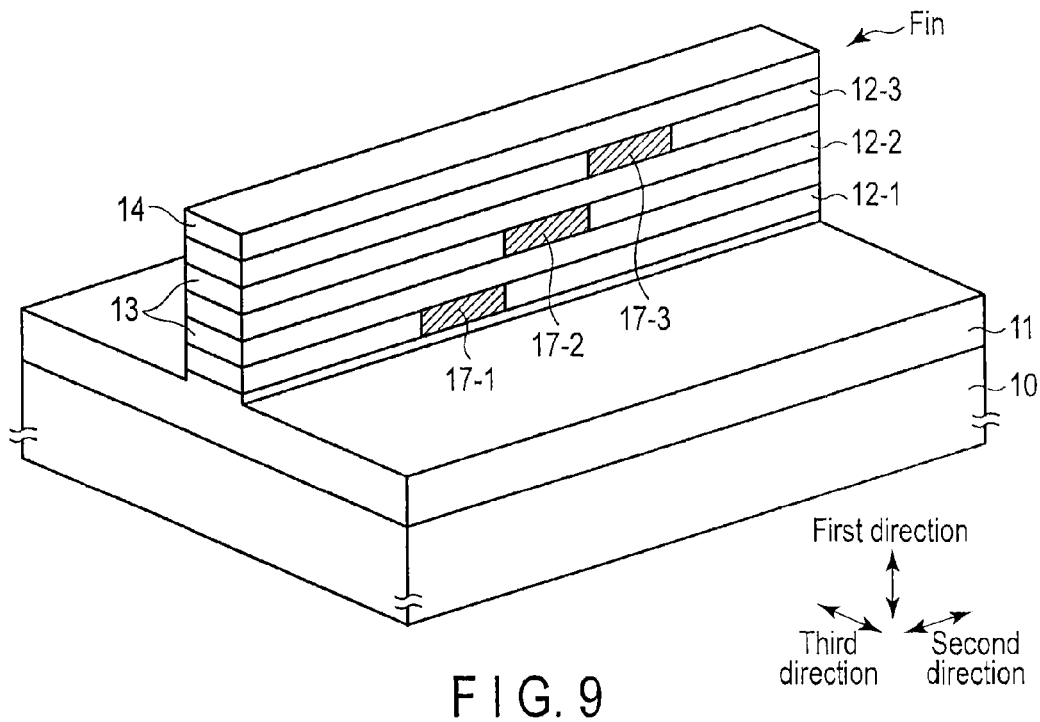
F I G. 9
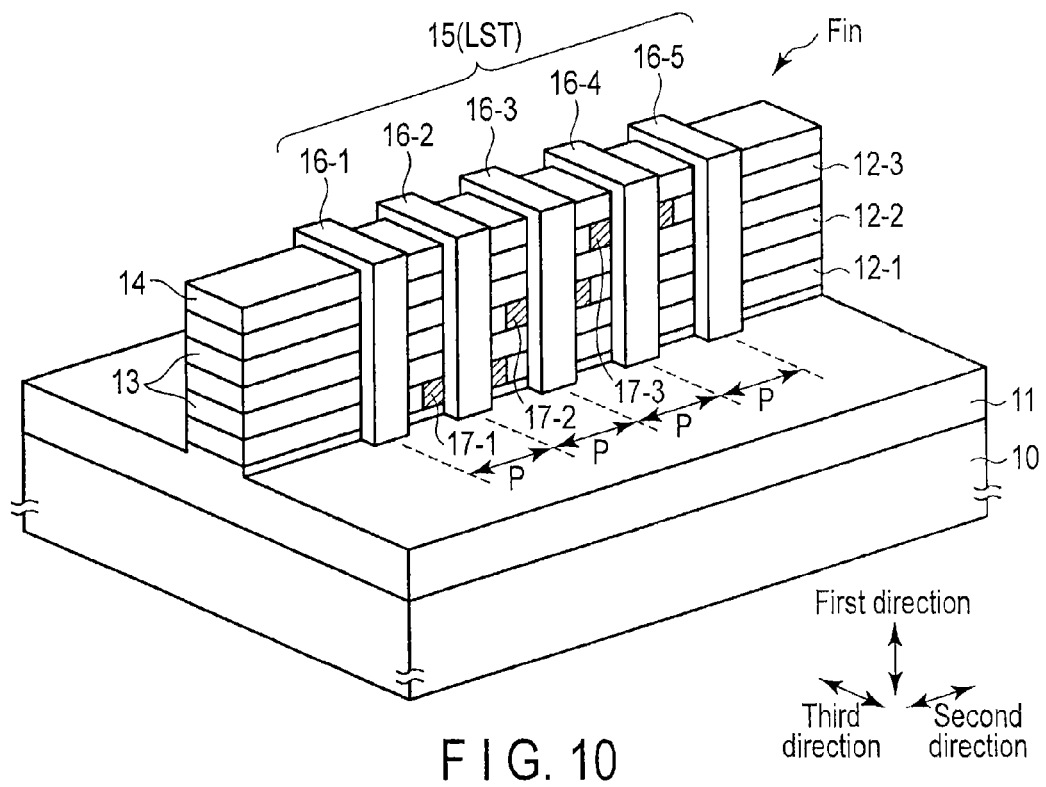
F I G. 10

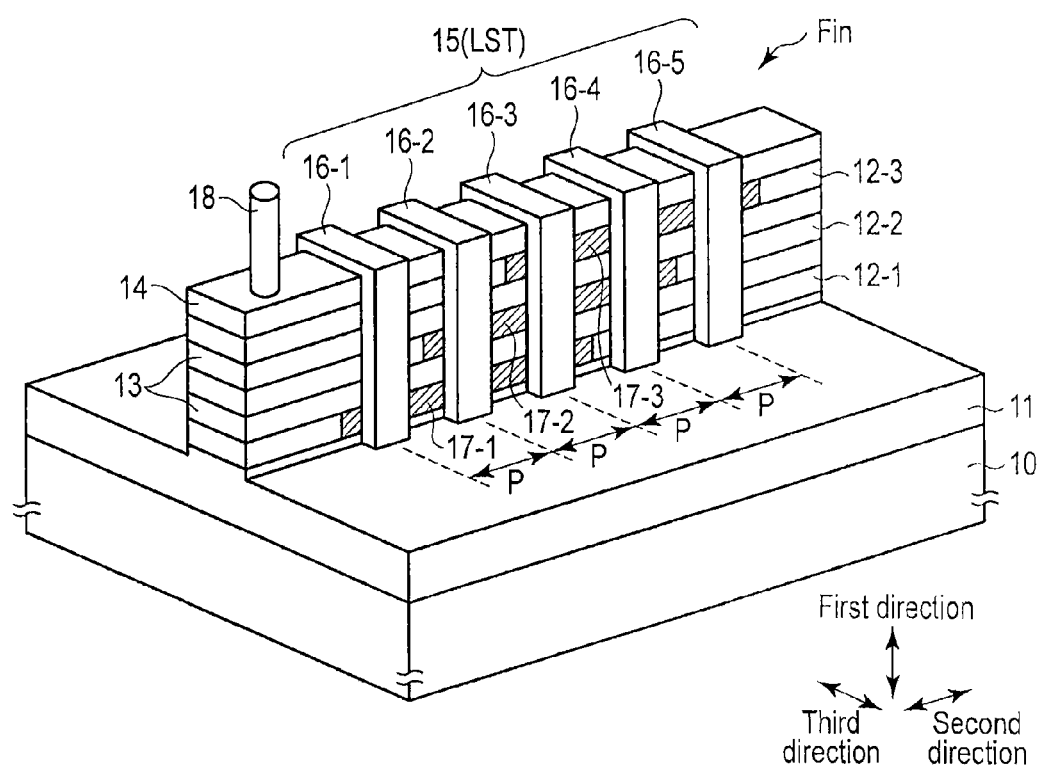
F I G. 11

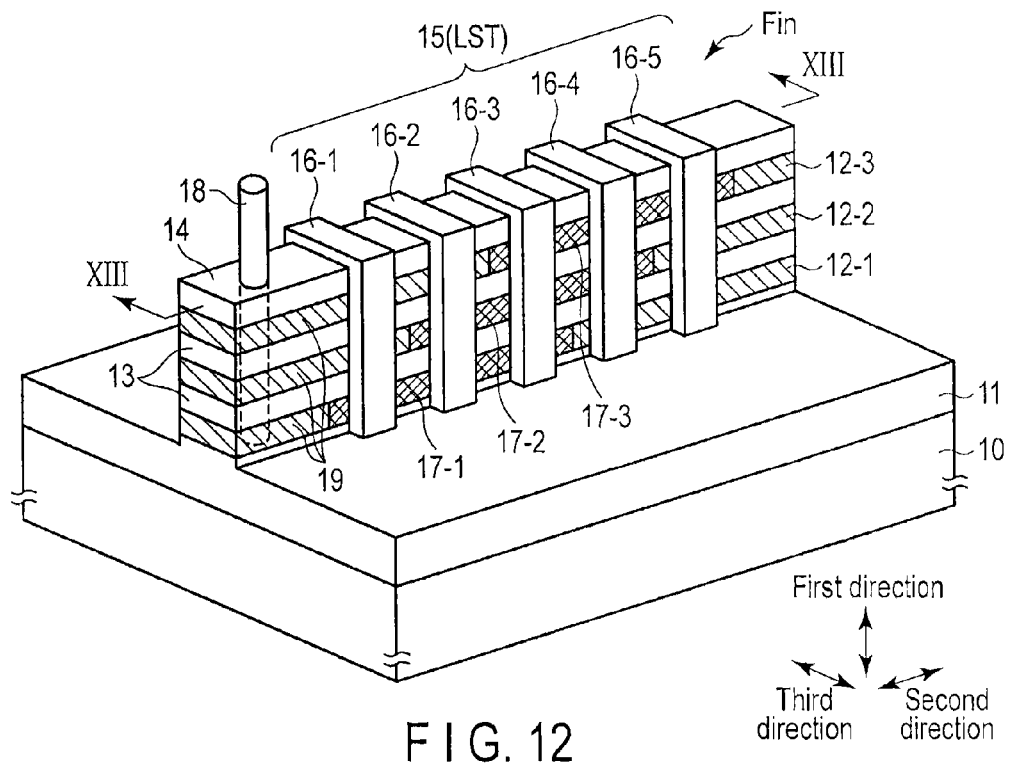
F I G. 12
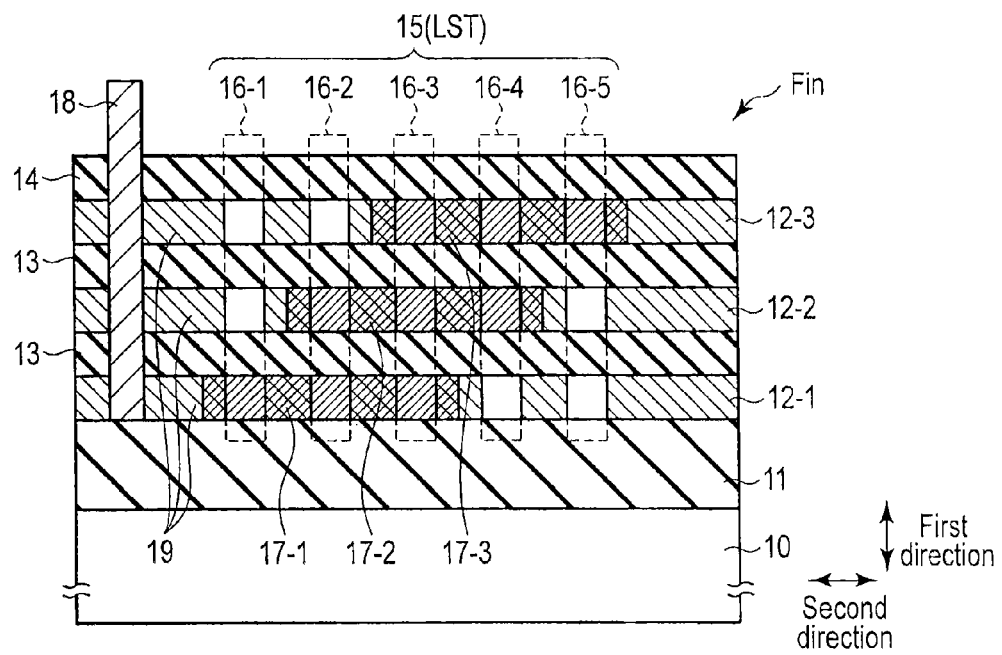
F I G. 13

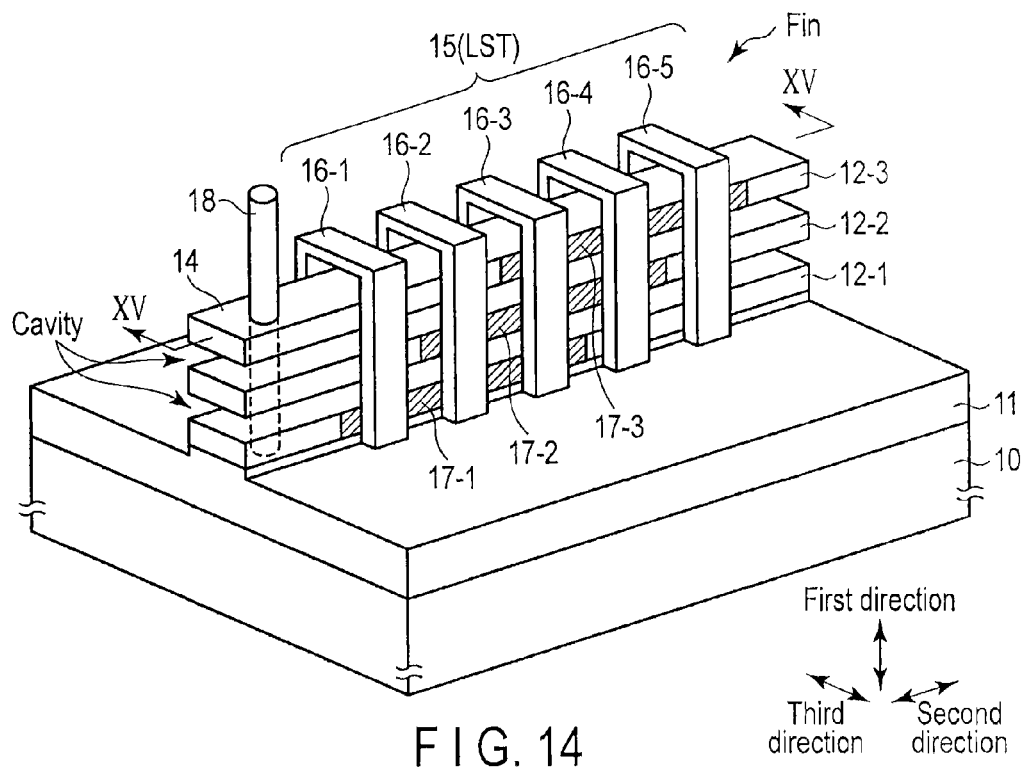
F I G. 14
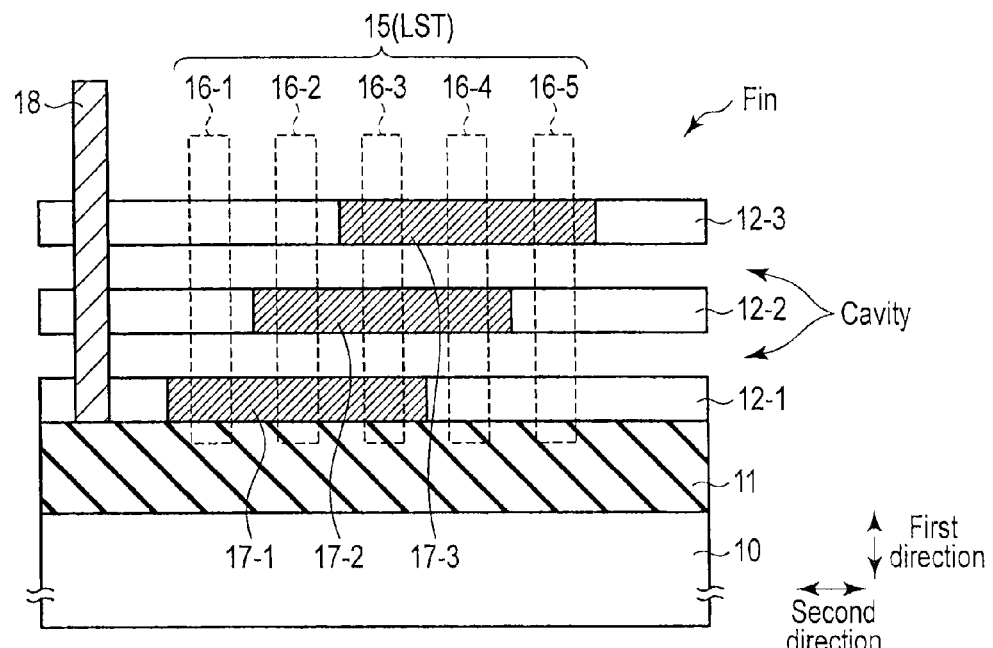
F I G. 15

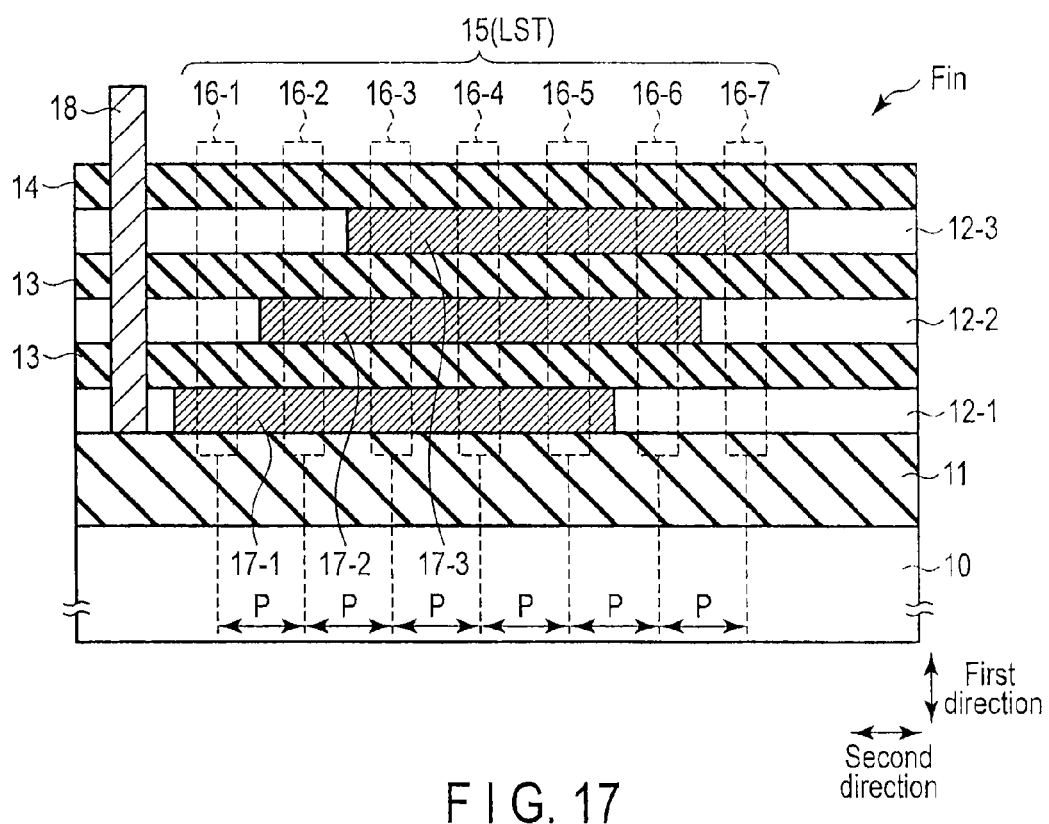
F I G. 17

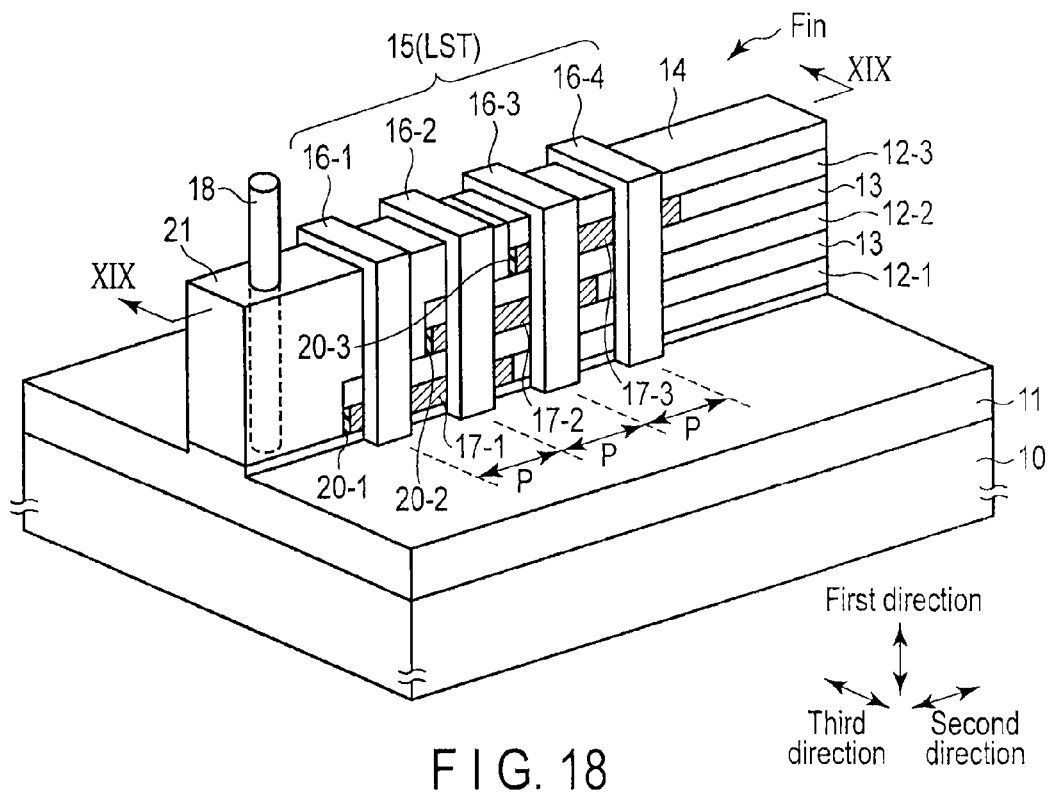
F I G. 18
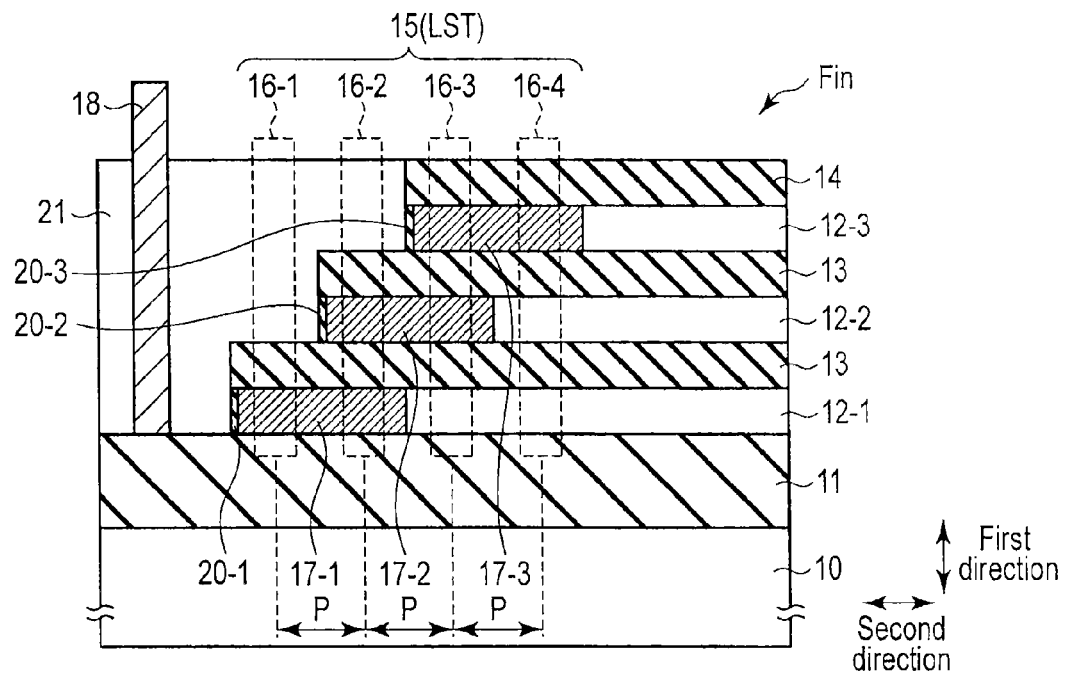
F I G. 19

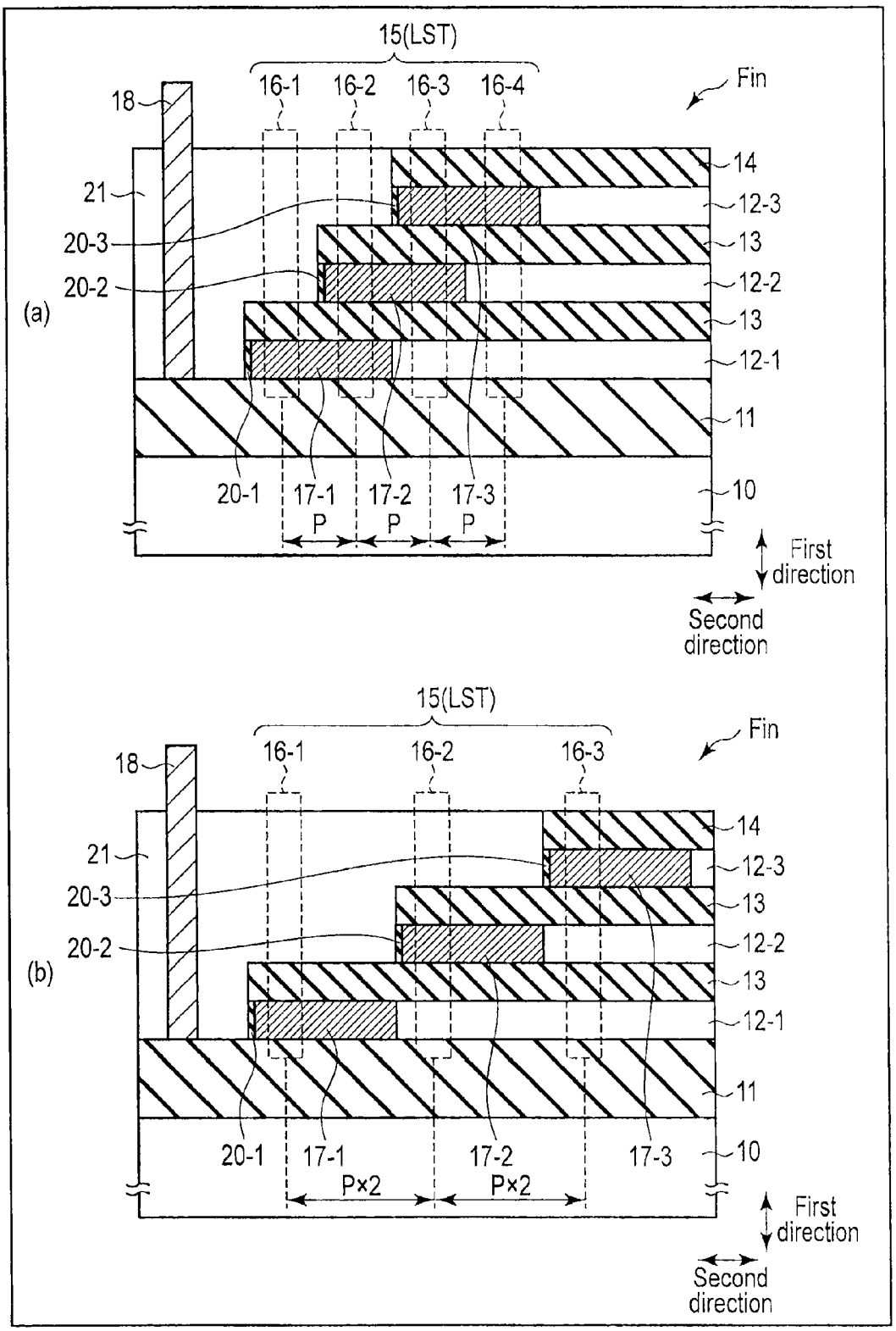
F I G. 20

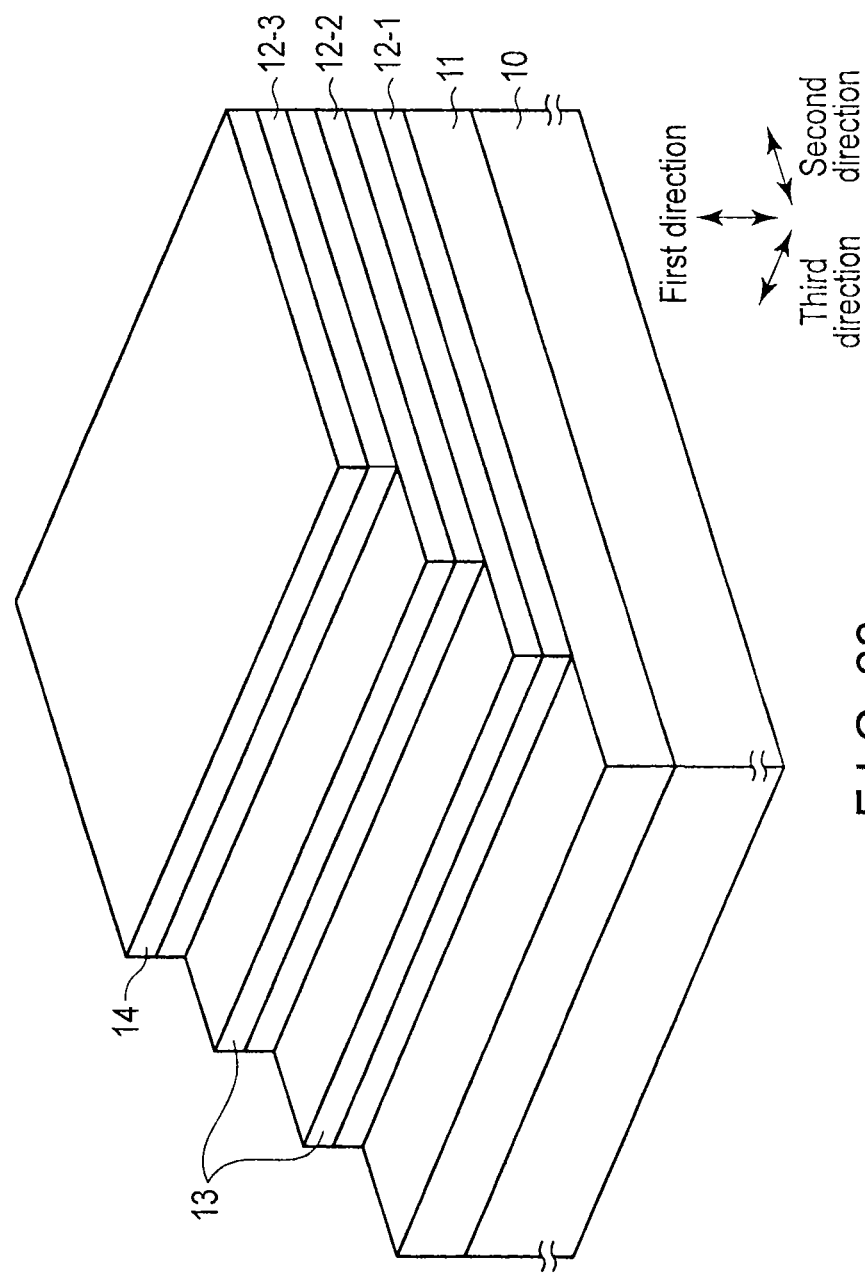
F I G. 22

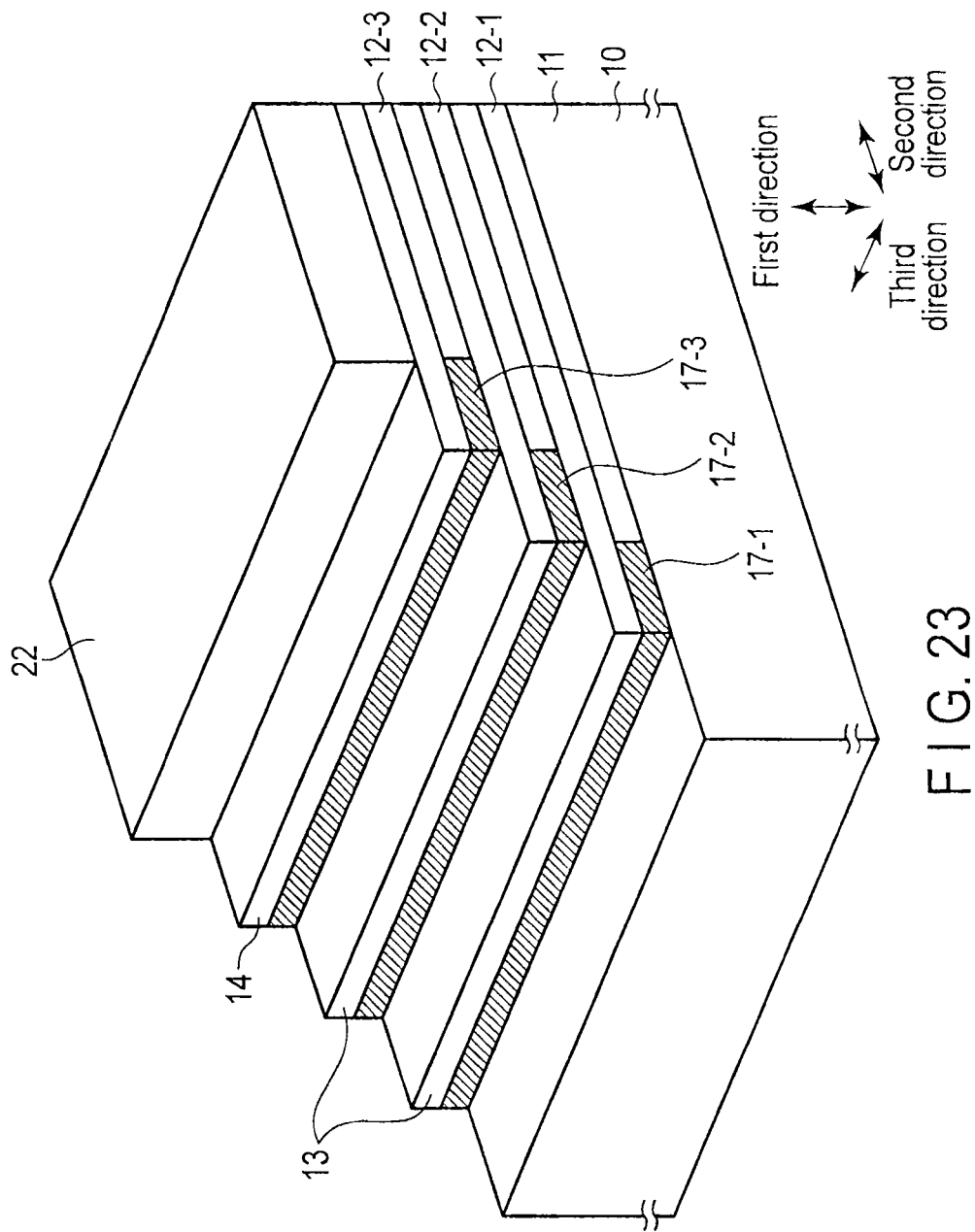
F I G. 23

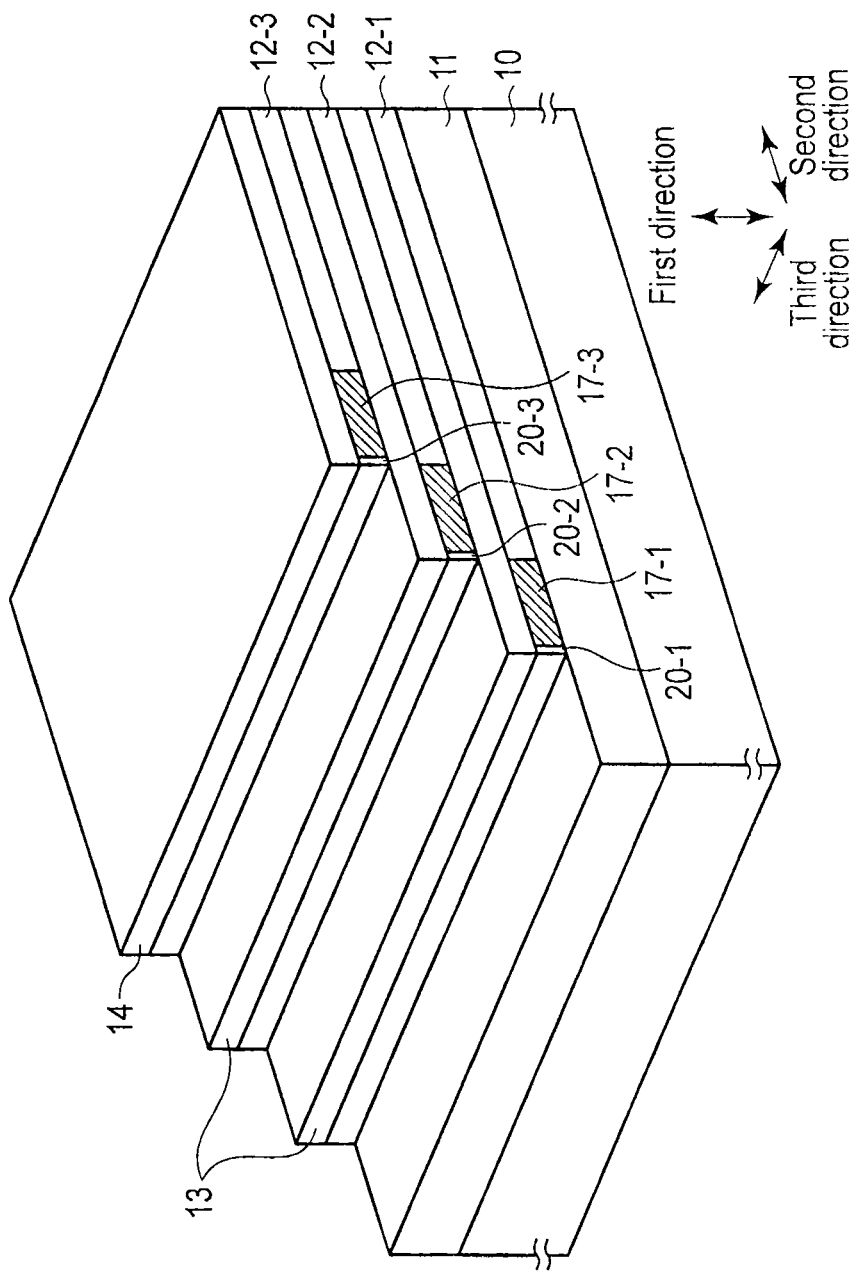
F I G. 24

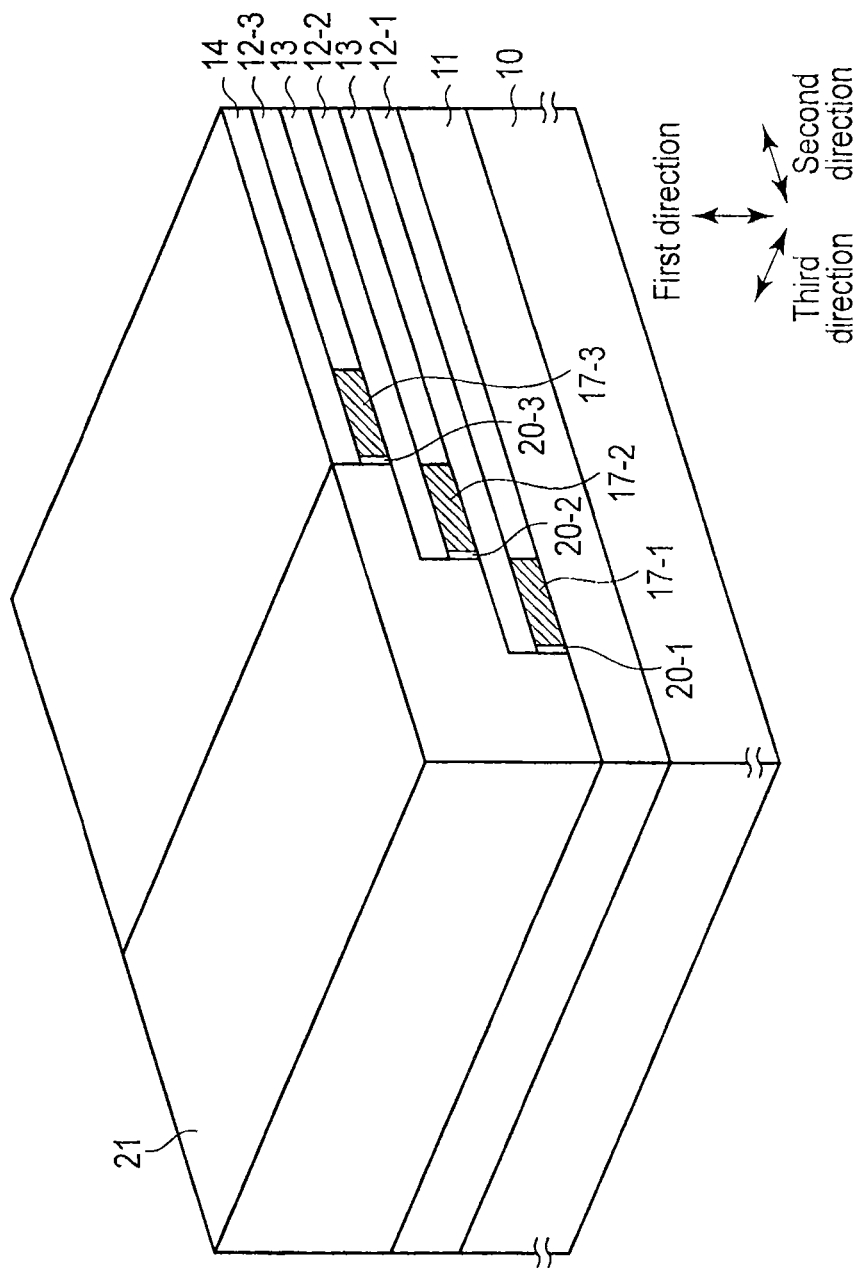
F I G. 25

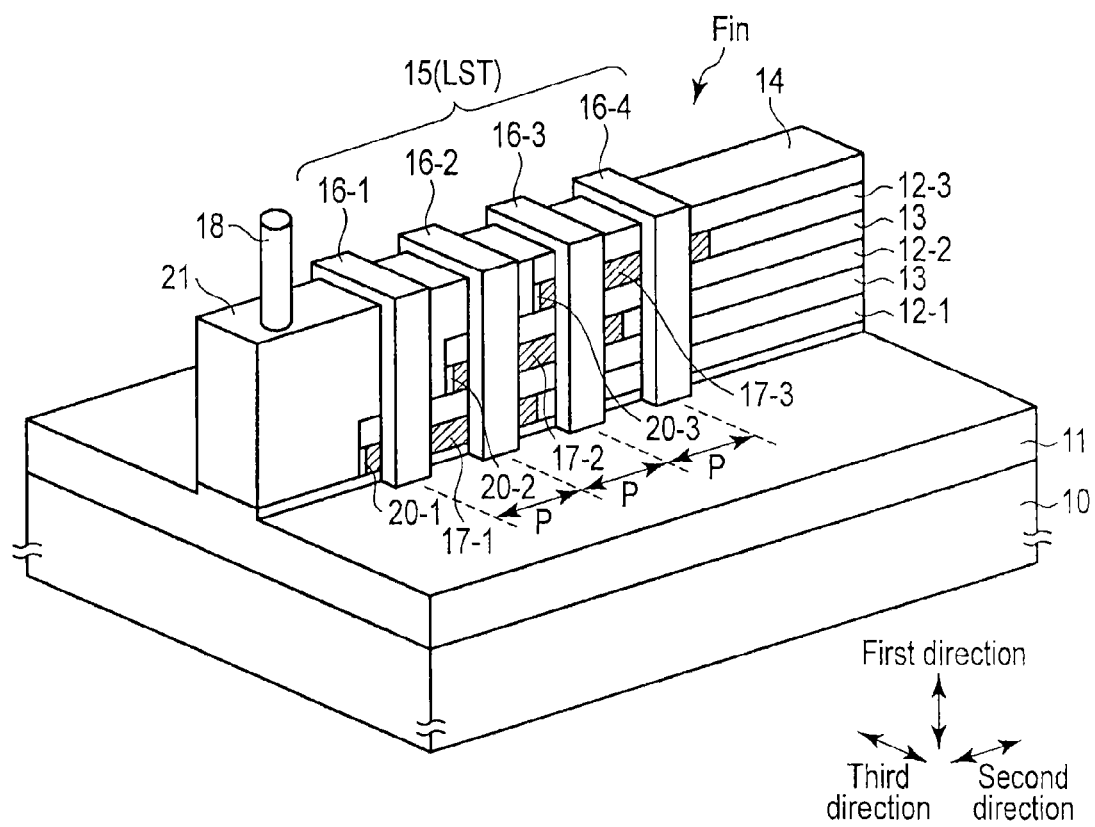
F I G. 28

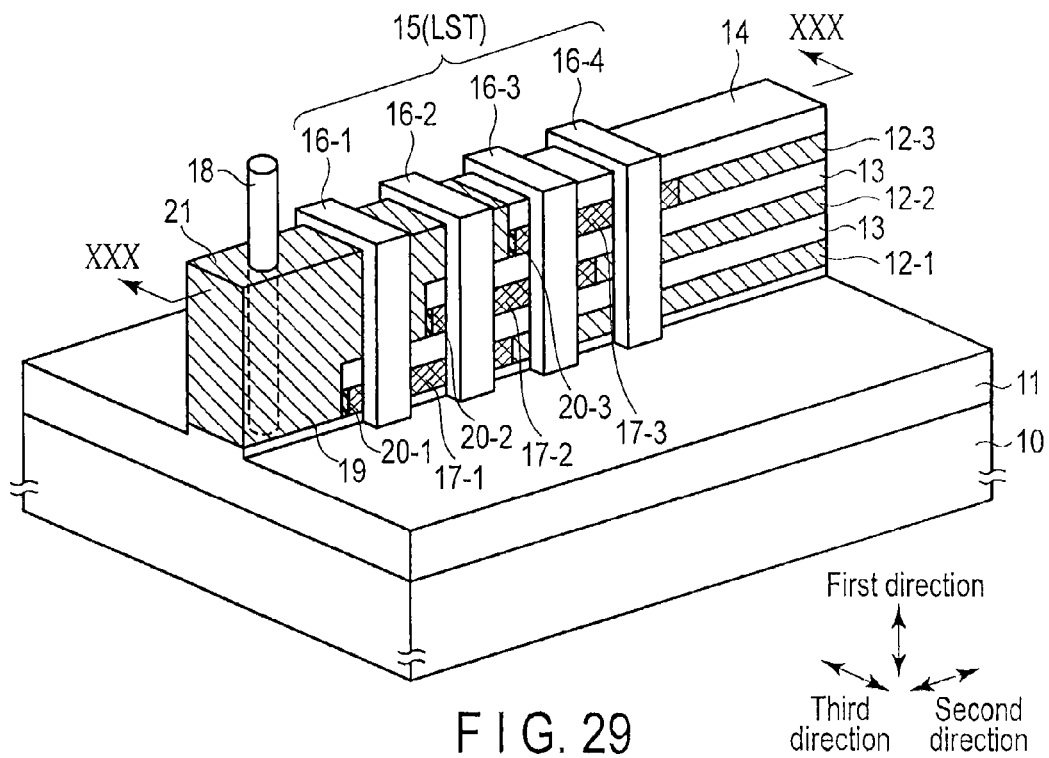
F I G. 29
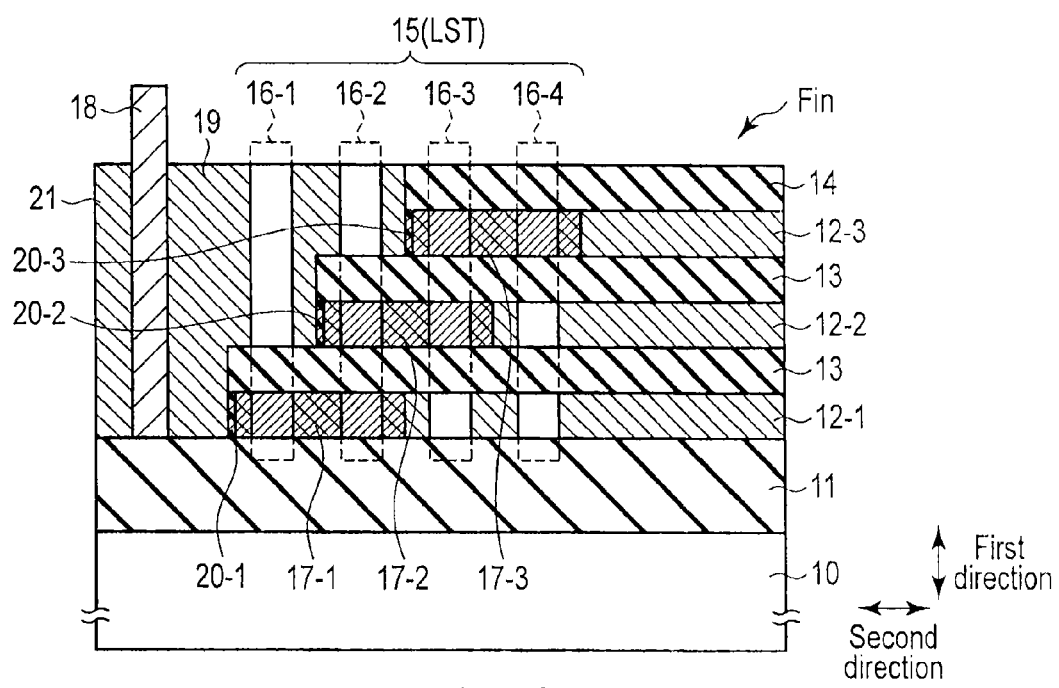
F I G. 30

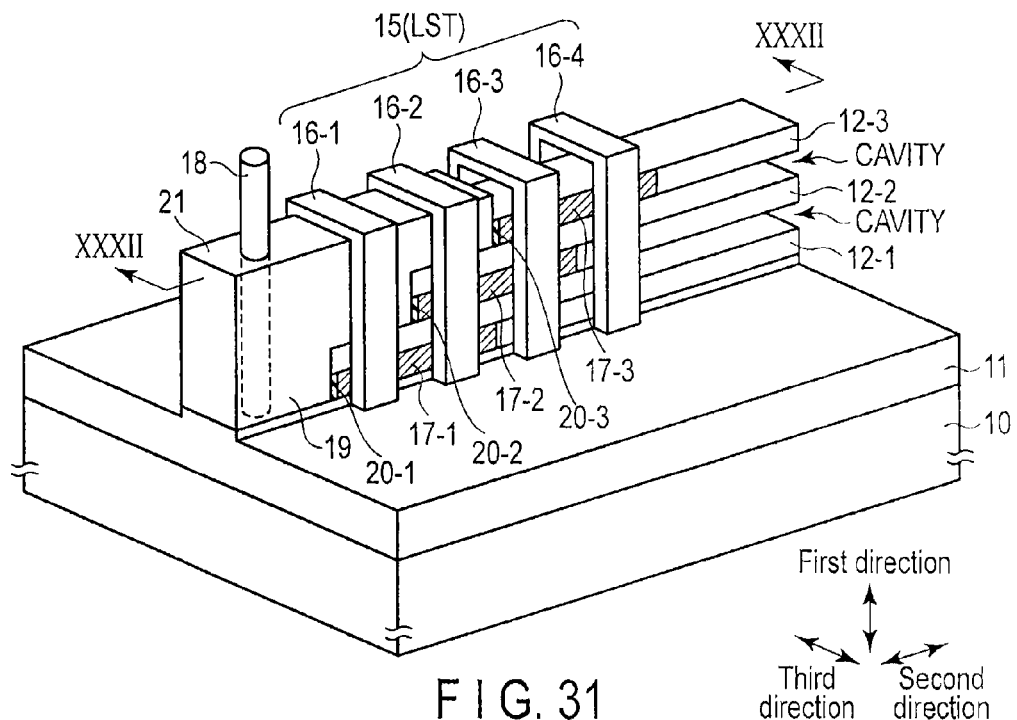
F I G. 31
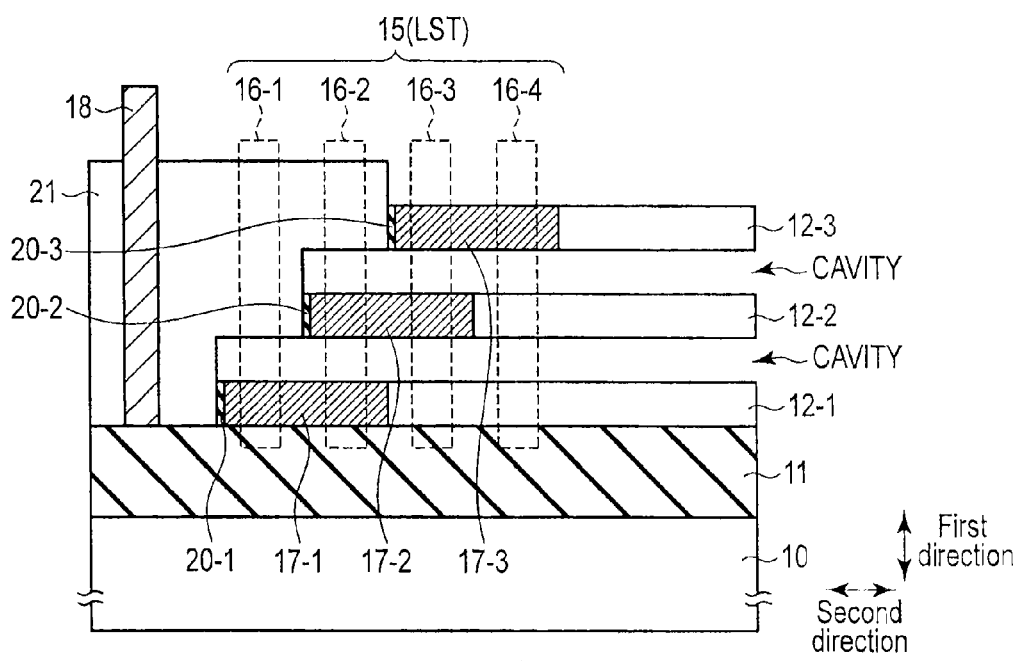
F I G. 32

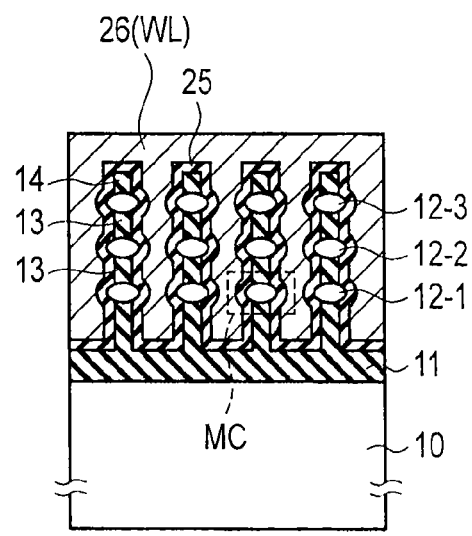
F I G. 36
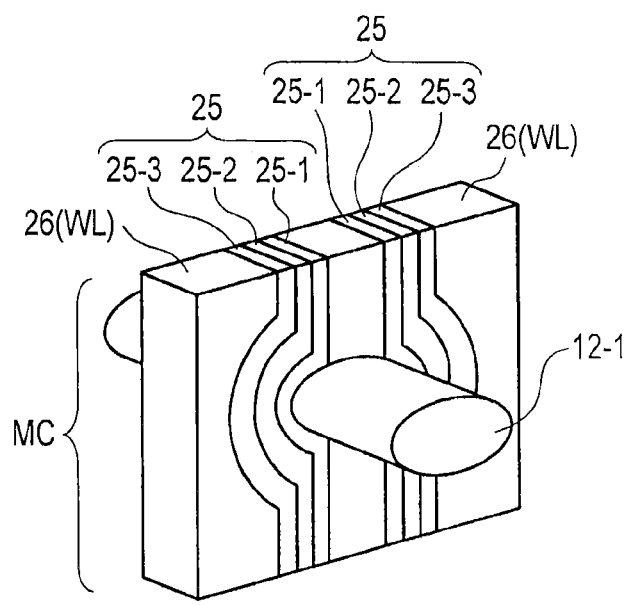
F I G. 37

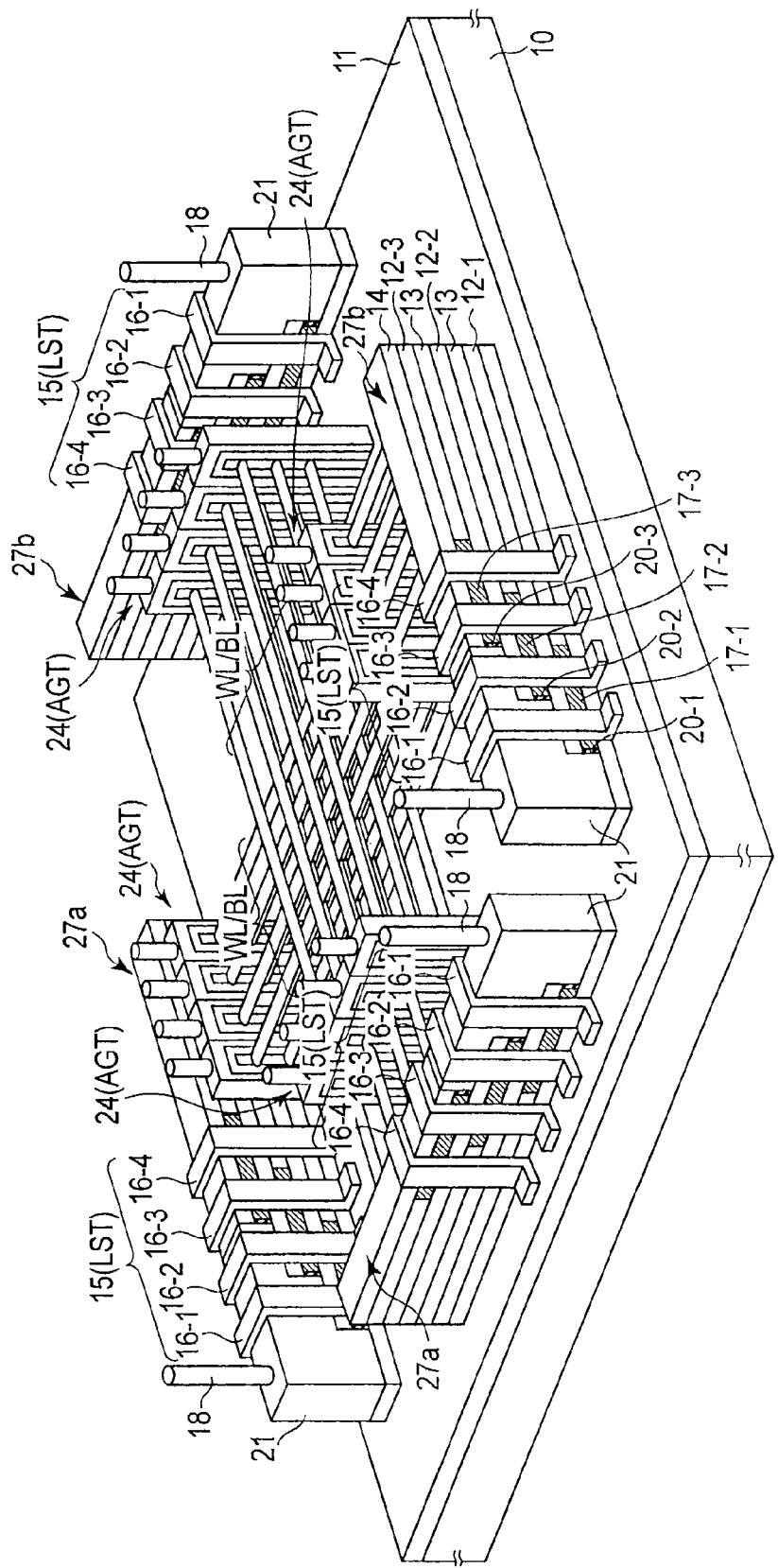
F I G. 38

US 8,710,580 B2

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2011-260667, filed Nov. 29, 2011, the entire contents of which are incorporated herein by reference.

FIELD

Embodiments described herein relate generally to a semiconductor device and a method of manufacturing the same.

BACKGROUND

Recently, studies have been conducted on a semiconductor device having a three-dimensional structure in which fin-type semiconductor layers (active regions) are stacked on a semiconductor substrate.

For example, if each semiconductor layer on the semiconductor substrate is used as a channel of a memory cell (cell transistor), a vertical gate three-dimensional nonvolatile memory referred to as a vertical gate ladder-bit cost scalable memory (VLB) can be constructed. If each semiconductor layer on the semiconductor substrate is used as a conductive line connected to a memory cell (resistance change element), a cross-point type three-dimensional nonvolatile memory can be constructed.

In order to operate a semiconductor device having a three-dimensional structure typified by the above-mentioned nonvolatile memories, a system is needed to selectively access one of semiconductor layers on a semiconductor substrate. There has been known a technique that provides a layer select transistor as one such system. This layer select transistor has a common gate electrode for the semiconductor layers (channels), and is normally on in one of the semiconductor layers and is on/off controllable in the rest of the semiconductor layers.

However, when one of the semiconductor layers is selected by the layer select transistor, it is necessary to arrange the same number of gate electrodes as the number of the stacked semiconductor layers. This causes problems to a selecting operation. For example, an impurity implanted in each semiconductor layer to allow the layer select transistor to be normally on is improperly diffused due to a heat treatment in a wafer process, and parts that originally need to be on/off controlled are normally on.

This problem is more serious when design rules are reduced and the pitch of the arranged gate electrodes is smaller.

BRIEF DESCRIPTION OF THE DRAWINGS

FIG. 1 is a perspective view showing a semiconductor device of a first embodiment;
FIG. 2 is a sectional view taken along line II-II in FIG. 1;
FIG. 3 and FIG. 4 are sectional views showing a comparative example;
FIG. 5 and FIG. 6 are diagrams showing a relation between a number of stacked layers and a size of a transistor;
FIG. 7 to FIG. 11 are perspective views showing a method of manufacturing the semiconductor device shown in FIG. 1;
FIG. 12 is a perspective view showing a first modification of the first embodiment;
FIG. 13 is a sectional view taken along line XIII-XIII in FIG. 12;
FIG. 14 is a perspective view showing a second modification of the first embodiment;
FIG. 15 is a sectional view taken along line XV-XV in FIG. 14;
FIG. 17 is a sectional view taken along line XVII-XVII in FIG. 16;
FIG. 18 is a perspective view showing a semiconductor device of a third embodiment;
FIG. 19 is a sectional view taken along line XIX-XIX in FIG. 18;
FIG. 20 is a diagram showing a relation between a number of stacked layers and a size of a transistor;
FIG. 21 to FIG. 28 are perspective views showing a method of manufacturing the semiconductor device shown in FIG. 18;
FIG. 29 is a perspective view showing a first modification of the third embodiment;
FIG. 30 is a sectional view taken along line XXX-XXX in FIG. 29;
FIG. 31 is a perspective view showing a second modification of the third embodiment;
FIG. 32 is a sectional view taken along line XXXII-XXXII in FIG. 31;
FIG. 36 is a sectional view taken along line XXXVI-XXXVI in FIG. 35;
FIG. 37 is a perspective view showing a memory cell of the memory in FIG. 35;
FIG. 38 is a perspective view showing a nonvolatile semiconductor memory of an application example.

DETAILED DESCRIPTION

Figure 6:
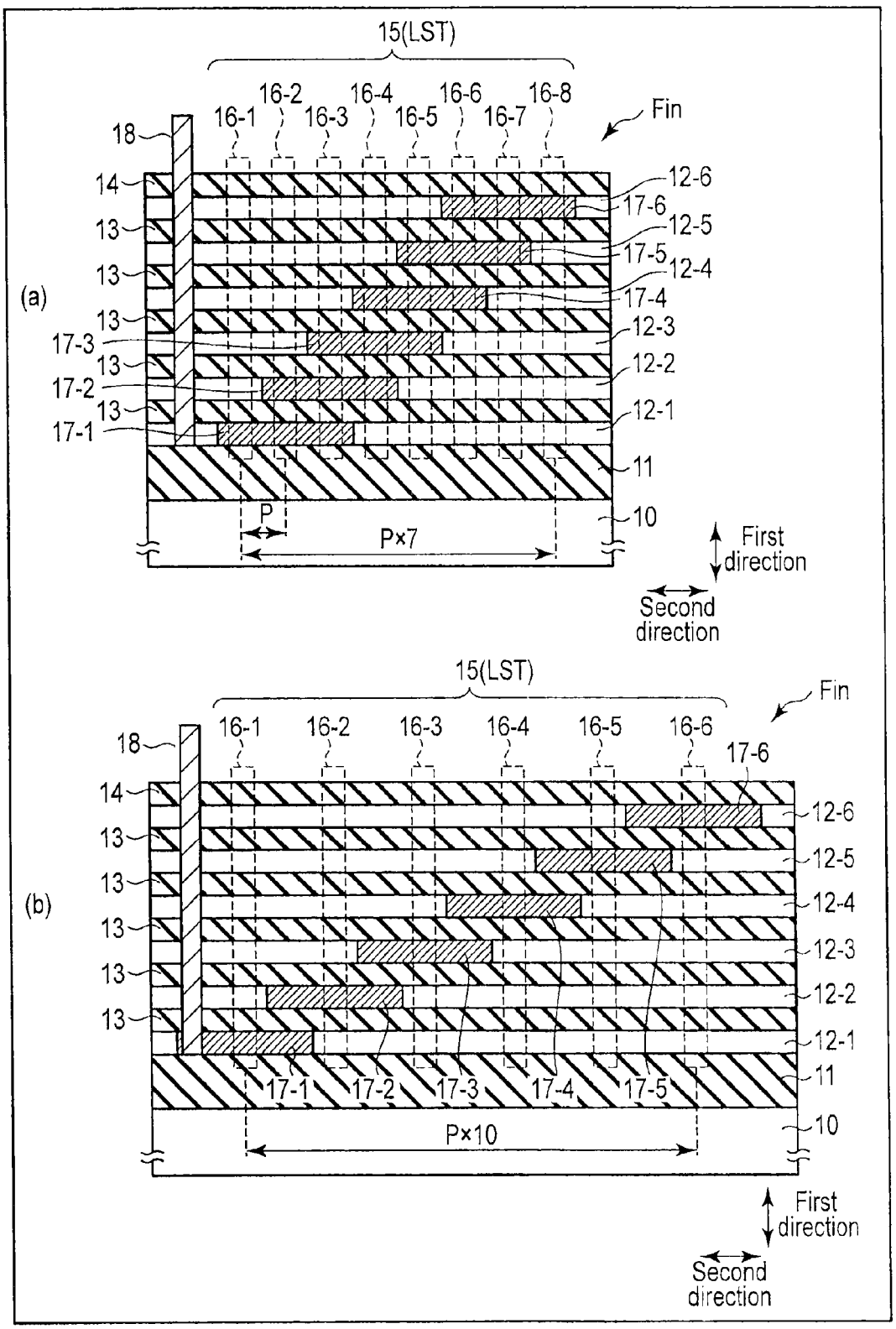

In general, according to one embodiment, a semiconductor device comprises: a semiconductor substrate; an insulating layer on the semiconductor substrate; first to n-th semiconductor layers (n is natural number equal to or more than 2) being stacked in order from a surface of the insulating layer in a first direction perpendicular to the surface of the insulating layer, the first to n-th semiconductor layers extending in a second direction parallel to the surface of the insulating layer, the first to n-th semiconductor layers being insulated from each other; a common electrode connected to the first to n-th semiconductor layers in a first end of the second direction thereof; and a layer select transistor which uses the first to n-th semiconductor layers as channels and which selects one of the first to n-th semiconductor layers. The layer select transistor comprises: first to m-th gate electrodes (m=n+k, k is an even number) which are arranged in order from the first end of the second direction of the first to n-th semiconductor layers toward a second end of the second direction of the first to n-th semiconductor layers, and which extend in the first direction along side surfaces of the first to n-th semiconductor layers exposing in a third direction perpendicular to the first and second directions; and an i-th normally-on region (i is one of 1 to n) which sets channels adjacent to the i-th to (i+k)-th gate electrodes in the i-th semiconductor layer to normally-on channels, the normally-on channels which are not dependent on potentials of the i-th to (i+k)-th gate electrodes.

Hereinafter, embodiments will be described with reference to the drawings. Like components are indicated by like reference signs throughout the embodiments, and repeated explanations are not given. The drawings are schematic views illustrating the invention and serving to promote the understanding of the invention. The shapes, dimensions, and ratios are different from those in an actual device in some parts, but can be properly designed and modified in view of the following explanations and known techniques.

Semiconductor devices according to the embodiments are based on the assumption that a normally-on region of a layer select transistor expands in a channel length direction as a result of a heat treatment conducted in a wafer process, and are characterized in that the layer select transistor having gate electrodes larger in number than semiconductor layers stacked on a semiconductor substrate is used to select a semiconductor layer.

The number of increased gate electrodes is minimized and the increase of the area of the layer select transistor is prevented by defining the relation between the expansion amount (impurity diffusion length) of the normally-on region and the number of the gate electrodes of the layer select transistor rather than by simply increasing the number of the gate electrodes of the layer select transistor.

For example, when first to n-th (n is a natural number equal to or more than 2) normally-on regions in first to n-th semiconductor layers expand on both sides, the layer select transistor comprises first to m-th gate electrodes (m=n+k, k is an even number). In this case, the i-th normally-on region (i is one of 1 to n) in the i-th semiconductor layer set channels adjacent to the i-th to (i+k)-th gate electrodes to normally-on channels (corresponding to the first and second embodiments).

Here, k is a value determined by the expansion amount (impurity diffusion length) of the normally-on region on one side. That is, k is set to j×2 when the i-th normally-on region formed in the channel adjacent to the (i+(k/2))-th gate electrode in the i-th semiconductor layer expands j times (j is a natural number) or more and less than (j+1) times the pitch of the first to m-th gate electrodes as a result of, for example, a heat treatment.

However, it is assumed that the initial size of the normally-on region in a channel length direction (the position of the end of the normally-on region before the diffusion of the impurity) corresponds to the channel length of the gate electrode (the position of the end of the gate electrode in the channel length direction).

When the first to n-th normally-on regions (n is a natural number equal to or more than 2) in the first to n-th semiconductor layers only expand on one side, the layer select transistor comprises first to m-th gate electrodes (m=n+k, k is a natural number). In this case, the i-th normally-on region (i is one of 1 to n) in the i-th semiconductor layer sets the channels adjacent to the i-th to (i+k)-th gate electrodes to normally-on channels (corresponding to the third and fourth embodiments).

k is set to j when the i-th normally-on region formed in the channel adjacent to the i-th gate electrode in the i-th semiconductor layer expands j times (j is a natural number) or more and less than (j+1) times the pitch of the first to m-th gate electrodes as a result of, for example, a heat treatment.

However, it is assumed that the initial size of the normally-on region in the channel length direction (the position of the end of the normally-on region before the diffusion of the impurity) corresponds to the channel length of the gate electrode (the position of the end of the gate electrode in the channel length direction).

As described above, the layer select transistor having the gate electrodes larger in number than the semiconductor layers stacked on the semiconductor substrate is used to select a semiconductor layer. Thus, even if the normally-on region of the layer select transistor expands in the channel length direction, a semiconductor layer can be correctly selected.

First Embodiment

FIG. 1 shows a semiconductor device according to the first embodiment. FIG. 2 is a sectional view taken along the line II-II in FIG. 1.

In the first embodiment, the number n of stacked semiconductor layers is 3, the expansion amount j of normally-on regions on one side is 1(k=j×2=2), and the number m(=n+k) of gate electrodes is 5.

Semiconductor substrate 10 is, for example, a silicon substrate. Insulating layer 11 is disposed on semiconductor substrate 10. First, second, and third semiconductor layers 12-1, 12-2, and 12-3 are stacked in an insulated state from the surface of insulating layer 11 in order in a first direction perpendicular to the surface of insulating layer 11, and extend in a second direction parallel to the surface of insulating layer 11.

In this embodiment, first, second, and third semiconductor layers 12-1, 12-2, and 12-3 are insulated from one another by insulating layer 13. Insulating layer 14 is disposed on third semiconductor layer 12-3 as an uppermost layer. Insulating layers 13 and 14 are, for example, silicon oxide layers. Insulating layer 14 can be a silicon nitride layer, or a stacked layer of a silicon oxide layer and a silicon nitride layer, instead of the silicon oxide layer.

First, second, and third semiconductor layers 12-1, 12-2, and 12-3 and insulating layers 13 and 14 constitute fin-type stacked layer structure Fin. First, second, and third semiconductor layers 12-1, 12-2, and 12-3 are preferably monocrystalline, but may be polycrystalline or amorphous.

At one end of fin-type stacked layer structure Fin in the second direction, common electrode 18 is connected in common to first, second, and third semiconductor layers 12-1, 12-2, and 12-3. Common electrode 18 comprises a metal layer of, for example, tungsten or aluminum.

Layer select transistor 15 (LST) is, for example, a field effect transistor (FET). Layer select transistor 15 (LST) uses first, second, and third semiconductor layers 12-1, 12-2, and 12-3 as channels, and selects one of first, second, and third semiconductor layers 12-1, 12-2, and 12-3.

Layer select transistor 15 (LST) has first, second, third, fourth, and fifth gate electrodes 16-1, 16-2, 16-3, 16-4, and 16-5 arranged in order from the side of common electrode 18 with constant pitch P in the second direction.

First, second, third, fourth, and fifth gate electrodes 16-1, 16-2, 16-3, 16-4, and 16-5 comprise metal silicide layers such as conductive polysilicon layers and nickel silicide layers, or stacks of these layers.

First, second, third, fourth, and fifth gate electrodes 16-1, 16-2, 16-3, 16-4, and 16-5 extend in the first direction along at least the side surfaces of first, second, and third semiconductor layers 12-1, 12-2, and 12-3 located in a third direction perpendicular to the first and second directions.

In this embodiment, first, second, third, fourth, and fifth gate electrodes 16-1, 16-2, 16-3, 16-4, and 16-5 cover the upper surface of fin-type stacked layer structure Fin in the first direction and the two side surfaces thereof in the second direction. That is, layer select transistor 15 (LST) is a fin-type FET having a double gate structure.

Layer select transistor 15 (LST) has first, second, and third normally-on regions 17-1, 17-2, and 17-3 in first, second, and third semiconductor layers 12-1, 12-2, and 12-3, respectively.

First, second, and third normally-on regions 17-1, 17-2, and 17-3 are impurity regions including an n-type impurity (a pentad such as arsenic or phosphorus), a p-type impurity (a triad such as boron or indium), or both of the above.

First normally-on region 17-1 present in first semiconductor layer 12-1 sets channels adjacent to first, second, and third gate electrodes 16-1, 16-2, and 16-3 to normally-on channels that are not dependent on the potentials of first, second, and third gate electrodes 16-1, 16-2, and 16-3.

Second normally-on region 17-2 present in second semiconductor layer 12-2 sets channels adjacent to second, third, and fourth gate electrodes 16-2, 16-3, and 16-4 to normally-on channels that are not dependent on the potentials of second, third, and fourth gate electrodes 16-2, 16-3, and 16-4.

Third normally-on region 17-3 present in third semiconductor layer 12-3 sets channels adjacent to third, fourth, and fifth gate electrodes 16-3, 16-4, and 16-5 to normally-on channels that are not dependent on the potentials of third, fourth, and fifth gate electrodes 16-3, 16-4, and 16-5.

Although layer select transistor 15 (LST) is an FET in the case described according to this embodiment, other switch elements can be used as layer select transistors. That is, layer select transistor 15 (LST) has only to have a switch function.

In the example shown according to this embodiment, first, second, and third normally-on regions 17-1, 17-2, and 17-3 are only formed in first, second, and third semiconductor layers 12-1, 12-2, and 12-3. However, impurity regions for controlling the threshold of layer select transistor 15 (LST) may be additionally provided in first, second, and third semiconductor layers 12-1, 12-2, and 12-3.

Table 1 shows a semiconductor layer selecting operation in the semiconductor device shown in FIG. 1.

TABLE 1

| Selected semiconductor layer | Gate potential of layer-select-transistor | | | | |
|---|---|---|---|---|---|
| | 16-1 | 16-2 | 16-3 | 16-4 | 16-5 |
| 12-3 | H | H | L | L | L |
| 12-2 | H | L | L | L | H |
| 12-1 | L | L | L | H | H |

According to the semiconductor device shown in FIG. 1, layer select transistor 15 (LST) associated with first gate electrode 16-1 is normally on (normally-on state) in first semiconductor layer 12-1 as a lowermost layer, and functions as a switch element in other second and third semiconductor layers 12-2 and 12-3.

Layer select transistor 15 (LST) associated with second gate electrode 16-2 is normally on (normally-on state) in first semiconductor layer 12-1 as the lowermost layer and in second semiconductor layer 12-2 as an interlayer, and functions as a switch element in other third semiconductor layer 12-3.

Layer select transistor 15 (LST) associated with third gate electrode 16-3 is normally on (normally-on state) in all first, second, and third semiconductor layers 12-1, 12-2, and 12-3.

Layer select transistor 15 (LST) associated with fourth gate electrode 16-4 is normally on (normally-on state) in second semiconductor layer 12-2 as the interlayer and in third semiconductor layer 12-3 as the uppermost layer, and functions as a switch element in other first semiconductor layer 12-1.

Layer select transistor 15 (LST) associated with third semiconductor layer 12-3 is normally on (normally-on state) in third semiconductor layer 12-3 as the uppermost layer, and functions as a switch element in other first and second semiconductor layers 12-1 and 12-2.

Therefore, by setting the potentials of first, second, third, fourth, and fifth gate electrodes 16-1, 16-2, 16-3, 16-4, and 16-5 to the relation shown in Table 1, one of first, second, and third semiconductor layers 12-1, 12-2, and 12-3 can be selected.

In Table 1, "H" refers to an on-potential that can set the channel of layer select transistor 15 (LST) to an on-channel (on-state), and "L" refers to an off-potential that can set the channel of layer select transistor 15 (LST) to an off-channel (off-state).

For example, when layer select transistor 15 (LST) is an n-channel FET, "H" is a positive potential and "L" is a ground potential. When layer select transistor 15 (LST) is a p-channel FET, "H" is a negative potential and "L" is a ground potential.

When first semiconductor layer 12-1 is selected, the potentials of first, second, and third gate electrodes 16-1, 16-2, and 16-3 are set to "L", and the potentials of fourth and fifth gate electrodes 16-4 and 16-5 are set to "H".

At the same time, layer select transistor 15 (LST) associated with first gate electrode 16-1 is off in second and third semiconductor layers 12-2 and 12-3, and layer select transistor 15 (LST) associated with second gate electrode 16-2 is off in third semiconductor layer 12-3, so that second and third semiconductor layers 12-2 and 12-3 are not selected. On the contrary, in first semiconductor layer 12-1, first normally-on region 17-1 is present, and all the channels adjacent to first to fifth gate electrodes 16-1 to 16-5 are therefore on.

Accordingly, first semiconductor layer 12-1 is selected.

When second semiconductor layer 12-2 is selected, the potentials of second, third, and fourth gate electrodes 16-2, 16-3, and 16-4 are set to "L", and the potentials of first and fifth gate electrodes 16-1 and 16-5 are set to "H".

At the same time, layer select transistor 15 (LST) associated with second gate electrode 16-2 is off in third semiconductor layer 12-3, and layer select transistor 15 (LST) associated with fourth gate electrode 16-4 is off in first semiconductor layer 12-1, so that first and third semiconductor layers 12-1 and 12-3 are not selected. On the contrary, in second semiconductor layer 12-2, second normally-on region 17-2 is present, and all the channels adjacent to first to fifth gate electrodes 16-1 to 16-5 are therefore on.

Accordingly, second semiconductor layer 12-2 is selected.

When third semiconductor layer 12-3 is selected, the potentials of third, fourth, and fifth gate electrodes 16-3, 16-4, and 16-5 are set to "L", and the potentials of first and second gate electrodes 16-1 and 16-2 are set to "H".

At the same time, layer select transistor 15 (LST) associated with fourth gate electrode 16-4 is off in first semiconductor layer 12-1, and layer select transistor 15 (LST) associated with fifth gate electrode 16-5 is off in first and second semiconductor layers 12-1 and 12-2, so that first and second semiconductor layers 12-1 and 12-2 are not selected. On the contrary, in third semiconductor layer 12-3, third normally-on region 17-3 is present, and all the channels adjacent to first to fifth gate electrodes 16-1 to 16-5 are therefore on.

Accordingly, third semiconductor layer 12-3 is selected.

As apparent from the selecting operation described above, layer select transistor 15 (LST) associated with third gate electrode 16-3 is normally on in all first, second, and third semiconductor layers 12-1, 12-2, and 12-3.

Thus, as shown in Table 2, third gate electrode 16-3 may be always set to a fixed potential ("H" or "L") or a floating state in the selecting operation described above.

TABLE 2

| Selected semiconductor layer | Gate potential of layer-select-transistor | | | | |
|---|---|---|---|---|---|
| | 16-1 | 16-2 | 16-3 | 16-4 | 16-5 |
| 12-3 | H | H | * | L | L |
| 12-2 | H | L | * | L | H |
| 12-1 | L | L | * | H | H |

* Fixed potential "H"/"L" or floating is possible

Owing the selecting operation described above, common electrode 18 connected to first, second, and third semiconductor layers 12-1, 12-2, and 12-3 has only to be provided for first, second, and third semiconductor layers 12-1, 12-2, and 12-3. That is, as it is not necessary to independently provide an electrode for each of first, second, and third semiconductor layers 12-1, 12-2, and 12-3, the size of a contact region can be reduced.

FIG. 3 and FIG. 4 show a comparative example.

In this comparative example, the number of stacked semiconductor layers is equal to the number of the gate electrodes of the layer select transistor.

FIG. 3 shows an ideal state. However, when a high-temperature heat treatment such as a baking treatment, a curing treatment, or a densifying treatment is needed in a wafer process, the impurity that forms the normally-on region is diffused as a result of the high-temperature heat treatment.

For example, according to experimental data, when a polycrystalline silicon layer is used as a semiconductor layer and a normally-on region is formed by adding arsenic (As), arsenic is diffused about 70 nm in the polycrystalline silicon layer by a heat treatment at 1000° C. for 10 seconds. Arsenic is diffused about 160 nm in the polycrystalline silicon layer by a heat treatment at 1000° C. for 20 seconds.

Therefore, when the pitch of the gate electrodes of the layer select transistor is 160 nm or more, normally-on regions 17-1 to 17-3 are changed from the state shown in FIG. 3 to the state shown in FIG. 4 by a heat treatment at 1000° C. for 20 seconds.

In the state shown in FIG. 4, normally-on region 17-2 extends over all gate electrodes 16-1 to 16-3 in second semiconductor layer 12-2, so that semiconductor layer 12-2 is always selected. That is, as second semiconductor layer 12-2 cannot be unselected, the selecting function by layer select transistor 15 (LST) is lost.

In contrast, according to the first embodiment, the state shown in FIG. 2 is set even if the normally-on region expands under the same condition as the comparative example. Therefore, the selecting function by layer select transistor 15 (LST) is not lost.

FIG. 5 shows the relation between the number of stacked semiconductor layers and the size of the layer select transistor.

In this embodiment, the number n of stacked semiconductor layers is 3.

(a) in FIG. 5 corresponds to the first embodiment shown in FIG. 1. In the first embodiment, the size of layer select transistor 15 (LST) in the second direction is P×4. Note that P is the pitch of gate electrodes 16-1 to 16-5.

The size of layer select transistor 15 (LST) in the second direction is the size of the gate electrodes of the layer select transistor from the center of the gate electrode located at one end in the second direction to the center of the gate electrode located at the other end in the second direction.

(b) in FIG. 5 corresponds to the comparative example shown in FIG. 4. However, in (b) in FIG. 5, the pitch of gate electrodes 16-1 to 16-3 in FIG. 4 is increased two times (P×2) so that the semiconductor layer selecting function is effective in the semiconductor device shown in FIG. 4.

In the comparative example, the size of layer select transistor 15 (LST) in the second direction is also P×4 as in the first embodiment.

Thus, when the number n of stacked semiconductor layers is 3, the size of layer select transistor 15 (LST) in the second direction according to the first embodiment is equal to the size of layer select transistor 15 (LST) in the second direction according to the comparative example.

The first embodiment also has the advantageous effect that allows the size of the layer select transistor in the second direction to be smaller than the size of the layer select transistor in the second direction according to the comparative example when the number n of stacked semiconductor layers is 4 or more. This advantageous effect is greater when the number n of stacked semiconductor layers is larger. The first embodiment therefore provides a highly effective technique when there is a demand for a largest possible number of stacked layers.

The relation between the number of stacked semiconductor layers and the size of the layer select transistor is generalized as follows.

In the first embodiment ((a) in FIG. 5), the size of the layer select transistor in the second direction is P×(n+k−1) when the number of stacked layers is n. In the first embodiment, k=2, so that the size of the layer select transistor in the second direction is P×(n+1). In contrast, according to the comparative example ((b) in FIG. 5), the size of the layer select transistor in the second direction is P×(n−1)×2 when the number of stacked layers is n.

For example, when the number n of stacked layers is 2, the size in the first embodiment is P×3, and the size in the comparative example is P×2. Thus, the layer select transistor in the first embodiment is larger than the layer select transistor in the comparative example.

However, when the number n of stacked layers is 4, the size in the first embodiment is P×5, and the size in the comparative example is P×6. When the number n of stacked layers is 5, the size in the first embodiment is P×6, and the size in the comparative example is P×8. When the number n of stacked layers is 6, the size in the first embodiment is P×7, and the size in the comparative example is P×10.

FIG. 6 shows the size (P×7) of layer select transistor 15 (LST) in the first embodiment ((a) in FIG. 6) in comparison with the size (P×10) of layer select transistor 15 (LST) in the comparative example ((b) in FIG. 6) when the number n of stacked semiconductor layers is 6.

As described above, when the number n of stacked layers is 4 or more, the layer select transistor in the first embodiment is smaller than the layer select transistor in the comparative example, and the difference therebetween increases with the increase in the number n of stacked layers.

FIG. 7 to FIG. 11 show a method of manufacturing the semiconductor device shown in FIG. 1.

Figure 7:
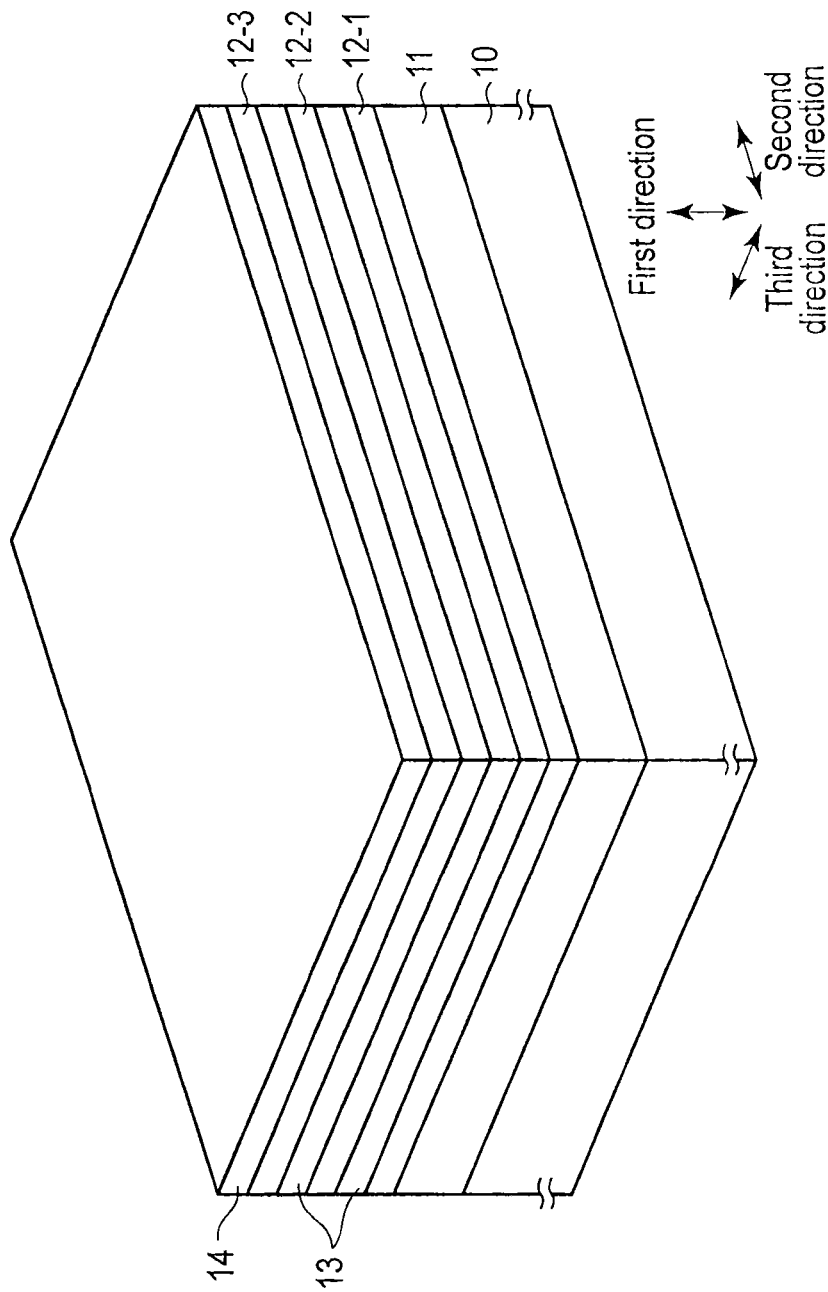

First, as shown in FIG. 7, a p-type silicon substrate, for example, having a plane direction (100) and a specific resistance of 10 to 20 Ωcm is prepared as semiconductor substrate 10. On this semiconductor substrate 10, silicon oxide layers as insulating layers 11 and 13, and 14 and polycrystalline silicon layers as first, second, and third semiconductor layers 12-1, 12-2, and 12-3 are alternately formed.

Figure 8:
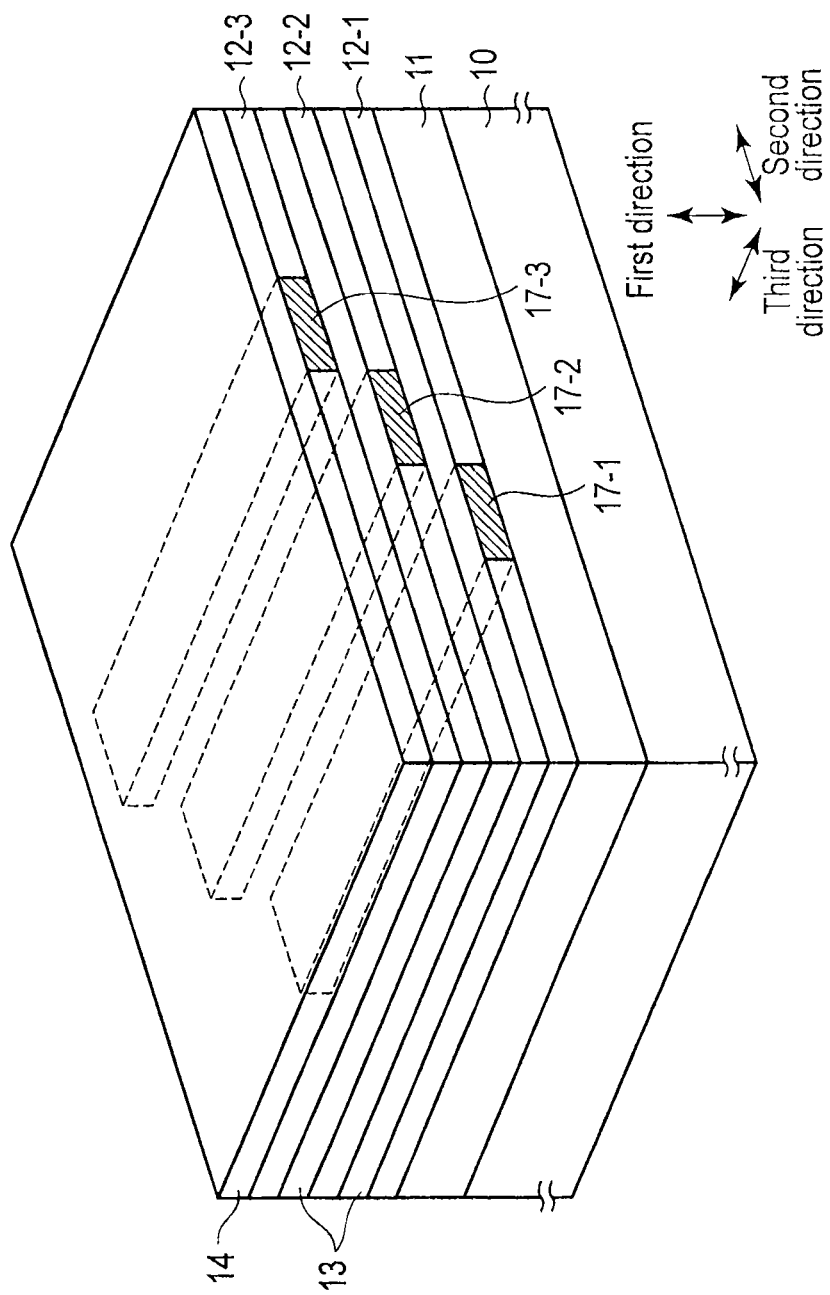

As shown in FIG. 8, first, second, and third normally-on regions 17-1, 17-2, and 17-3 are then formed in first, second, and third semiconductor layers 12-1, 12-2, and 12-3, for example, by photo engraving process (PEP) and ion implantation. Each of normally-on regions 17-1, 17-2, and 17-3 is separately formed. The ion implantation is conducted by implanting, for example, arsenic ions into first, second, and third semiconductor layers 12-1, 12-2, and 12-3 at a predetermined accelerating voltage.

In this embodiment, first, second, and third normally-on regions 17-1, 17-2, and 17-3 are formed in first, second, and third semiconductor layers 12-1, 12-2, and 12-3 after all first, second, and third semiconductor layers 12-1, 12-2, and 12-3 have been formed.

Instead, first normally-on region 17-1 may be formed immediately after first semiconductor layer 12-1 has been formed, and second normally-on region 17-2 may be then formed immediately after second semiconductor layer 12-2 has been formed, and moreover, third normally-on region 17-3 may be then formed immediately after third semiconductor layer 12-3 has been formed.

As shown in FIG. 9, insulating layers 13 and 14 and first, second, and third semiconductor layers 12-1, 12-2, and 12-3 are then patterned by PEP and reactive ion etching (RIE), and fin-type stacked layer structure Fin is thereby formed.

As shown in FIG. 10, a gate insulating layer (e.g. a silicon oxide layer) covering fin-type stacked layer structure Fin, and a conductive layer on the gate insulating layer are then formed on insulating layer 11. This conductive layer is patterned by PEP and RIP to form first, second, third, fourth, and fifth gate electrodes 16-1, 16-2, 16-3, 16-4, and 16-5 arranged with constant pitch P in the second direction.

First, second, third, fourth, and fifth gate electrodes 16-1, 16-2, 16-3, 16-4, and 16-5 are formed to cover the upper surface of fin-type stacked layer structure Fin in the first direction and the two side surfaces thereof in the second direction.

At this point, first normally-on region 17-1 is only formed in the channel adjacent to second gate electrode 16-2, second normally-on region 17-2 is only formed in the channel adjacent to third gate electrode 16-3, and third normally-on region 17-3 is only formed in the channel adjacent to fourth gate electrode 16-4.

After the gate insulating layer and the conductive layer have been formed, the upper surface of the conductive layer may be planarized by chemical mechanical polishing (CMP) before the formation of first, second, third, fourth, and fifth gate electrodes 16-1, 16-2, 16-3, 16-4, and 16-5.

The CMP may be conducted with an insulating layer filling regions other than fin-type stacked layer structure Fin. In this case, the insulating layer filling the regions other than fin-type stacked layer structure Fin is removed after the CMP, and first, second, third, fourth, and fifth gate electrodes 16-1, 16-2, 16-3, 16-4, and 16-5 are then formed by PEP and RIE.

As shown in FIG. 11, common electrode 18 connected in common to first, second, and third semiconductor layers 12-1, 12-2, and 12-3 is then formed at one end of fin-type stacked layer structure Fin in the second direction.

First, second, and third normally-on regions 17-1, 17-2, and 17-3 expand in the second direction as a result of a high-temperature heat treatment such as a baking treatment, a curing treatment, or a densifying treatment conducted after the formation of the normally-on regions.

In this embodiment, first, second, and third normally-on regions 17-1, 17-2, and 17-3 expand one time or more or less than two times pitch P of first, second, third, fourth, and fifth gate electrodes 16-1, 16-2, 16-3, 16-4, and 16-5.

However, it is assumed that the end of first normally-on region 17-1 in the second direction before the diffusion of the impurity corresponds to the end of second gate electrode 16-2 in the second direction, the end of second normally-on region 17-2 in the second direction before the diffusion of the impurity corresponds to the end of third gate electrode 16-3 in the second direction, and the end of third normally-on region 17-3 in the second direction before the diffusion of the impurity corresponds to the end of fourth gate electrode 16-4 in the second direction.

The semiconductor device shown in FIG. 1 is completed by the process described above.

FIG. 12 shows a first modification of the first embodiment. FIG. 13 is a sectional view taken along the line XIII-XIII in FIG. 12.

The first modification is characterized in that low-resistance region 19 having a resistance value lower than the resistance values of first, second, and third semiconductor layers 12-1, 12-2, and 12-3 is provided in regions that are not covered by first, second, third, fourth, and fifth gate electrodes 16-1, 16-2, 16-3, 16-4, and 16-5 in the side surfaces of first, second, and third semiconductor layers 12-1, 12-2, and 12-3 in the third direction, in contrast with the first embodiment.

The configuration is the same as that of the semiconductor device according to the first embodiment in other respects, and is therefore not described here.

Low-resistance region 19 is, for example, an impurity region different from first, second, and third normally-on regions 17-1, 17-2, and 17-3. In this case, the impurity in low-resistance region 19 may be the same as or different from the impurity in first, second, and third normally-on regions 17-1, 17-2, and 17-3.

Otherwise, low-resistance region 19 is a metal silicide layer such as a nickel silicide layer. In this case, low-resistance region 19 is formed by, after a metal layer covering fin-type stacked layer structure Fin has been formed, causing a silicide reaction between the metal layer and first, second, and third semiconductor layers 12-1, 12-2, and 12-3 and then removing the unreacted metal layer.

According to this modification, parasitic resistance is reduced by low-resistance region 19, and memory characteristics such as the operation speed can be improved.

FIG. 14 shows a second modification of the first embodiment. FIG. 15 is a sectional view taken along the line XV-XV in FIG. 14.

The second modification is characterized in that the spaces between first, second, and third semiconductor layers 12-1, 12-2, and 12-3 are cavities and the spaces between first, second, third, fourth, and fifth gate electrodes 16-1, 16-2, 16-3, 16-4, and 16-5 and fin-type stacked layer structure Fin are cavities, in contrast with the first embodiment.

The configuration is the same as that of the semiconductor device according to the first embodiment in other respects, and is therefore not described here.

The cavities are formed by selectively removing insulating layers 13 and 14 shown in FIG. 1 and FIG. 2 after the structure shown in the first embodiment (FIG. 1 and FIG. 2) has been formed. In this case, first, second, and third semiconductor layers 12-1, 12-2, and 12-3 are supported by first, second, third, fourth, and fifth gate electrodes 16-1, 16-2, 16-3, 16-4, and 16-5.

According to this modification, the performance of insulation of the semiconductor layers can be improved by forming the cavities in the insulating regions, so that the reliability of a memory element is improved.

As described above, according to the first embodiment and the modifications thereof, one of the semiconductor layers stacked on the semiconductor substrate can be correctly selected even if design rules are reduced.

Second Embodiment

Figure 16:
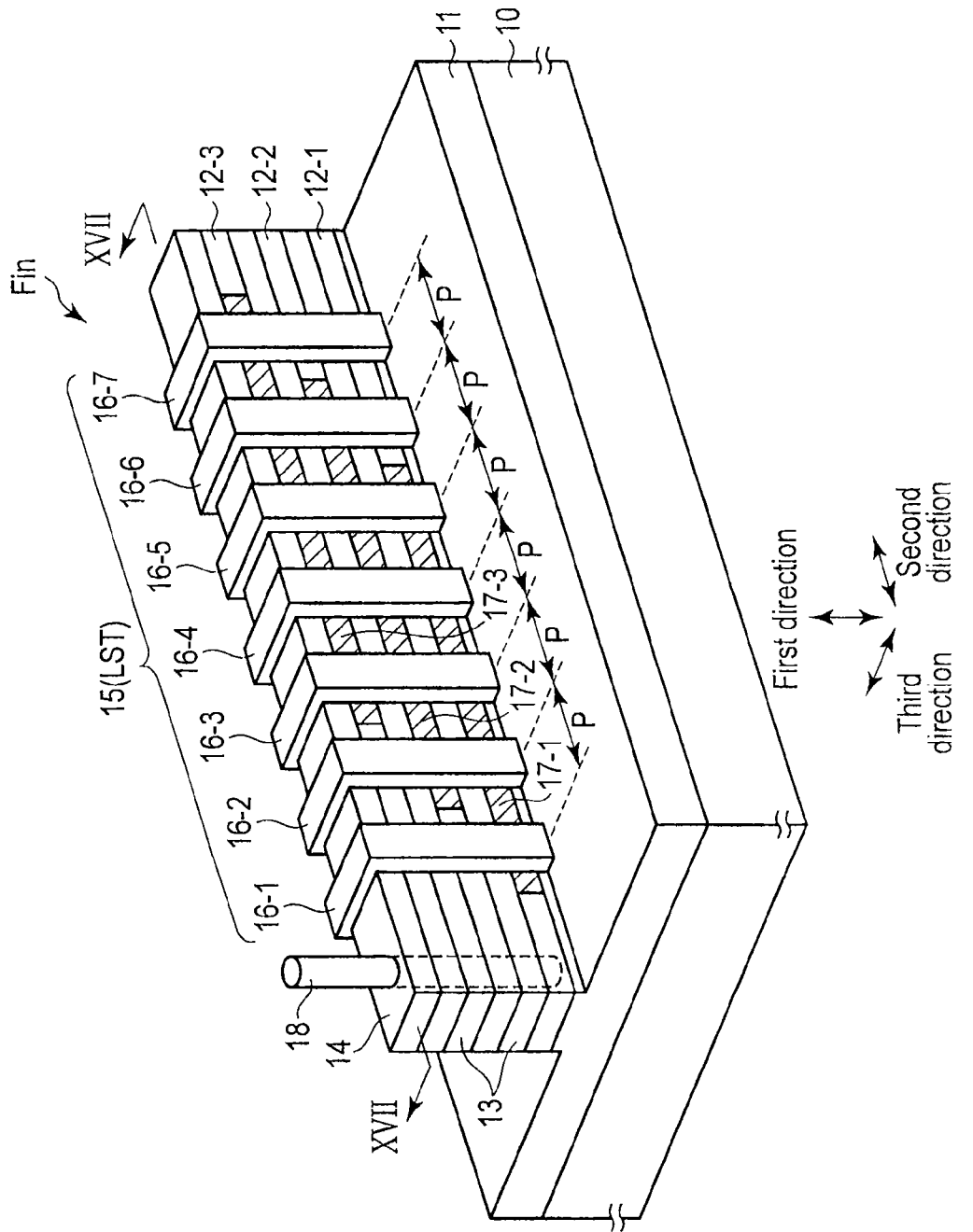
FIG. 16 is a perspective view showing a semiconductor device of a second embodiment.

FIG. 16 shows a semiconductor device according to the second embodiment. FIG. 17 is a sectional view taken along the line XVII-XVII in FIG. 16.

In the second embodiment, the number n of stacked semiconductor layers is 3, the expansion amount j of normally-on regions on one side is 2(k=j×2=4), and the number m(=n+k) of gate electrodes is 7.

The expansion amounts of first, second, and third normally-on regions 17-1, 17-2, and 17-3 in the second direction depend on, for example, the temperature and time (sum) of a high-temperature heat treatment (e.g. a baking treatment, a curing treatment, or a densifying treatment) conducted after the formation of the normally-on regions.

As has already been described, for example, according to experimental data, when a polycrystalline silicon layer is used as a semiconductor layer and a normally-on region is formed by adding arsenic (As), arsenic is diffused about 70 nm in the polycrystalline silicon layer by a heat treatment at 1000° C. for 10 seconds. Arsenic is diffused about 160 nm in the polycrystalline silicon layer by a heat treatment at 1000° C. for 20 seconds.

Thus, in the case described according to the second embodiment, the expansion amounts of first, second, and third normally-on regions 17-1, 17-2, and 17-3 are greater than in the first embodiment. More specifically, first, second, and third normally-on regions 17-1, 17-2, and 17-3 expand two times pitch P of gate electrodes.

In this case, first, second, third, fourth, fifth, sixth, and seventh gate electrodes 16-1, 16-2, 16-3, 16-4, 16-5, 16-6, and 16-7 are arranged with constant pitch P in the second direction.

First normally-on region 17-1 sets channels adjacent to first, second, third, fourth, and fifth gate electrodes 16-1, 16-2, 16-3, 16-4, and 16-5 to be normally on in first semiconductor layer 12-1.

Second normally-on region 17-2 sets channels adjacent to second, third, fourth, fifth, and sixth gate electrodes 16-2, 16-3, 16-4, 16-5, and 16-6 to be normally on in second semiconductor layer 12-2.

Third normally-on region 17-3 sets channels adjacent to third, fourth, fifth, sixth, and seventh gate electrodes 16-3, 16-4, 16-5, 16-6, and 16-7 to be normally on in third semiconductor layer 12-3.

Here, the relation between the number of stacked semiconductor layers and the size of a layer select transistor is generalized as in the first embodiment as follows.

In the second embodiment as well, the size of the layer select transistor in the second direction is P×(n+k−1) when the number of stacked layers is n. In the second embodiment, k=4, so that the size of the layer select transistor in the second direction is P×(n+3). In contrast, according to a comparative example (the same structure as that in (b) in FIG. 5 is assumed), the size of the layer select transistor in the second direction is P×(n−1)×3 when the number of stacked layers is n.

For example, when the number n of stacked layers is 2, the size in the second embodiment is P×5, and the size in the comparative example is P×3. Thus, the layer select transistor in the second embodiment is larger than the layer select transistor in the comparative example.

When the number n of stacked layers is 3, the size in the second embodiment is P×6, and the size in the comparative example is P×6, and the layer select transistor in the second embodiment is the same size as the layer select transistor in the comparative example.

When the number n of stacked layers is 4, the size in the second embodiment is P×7, and the size in the comparative example is P×9. When the number n of stacked layers is 5, the size in the second embodiment is P×8, and the size in the comparative example is P×12. When the number n of stacked layers is 6, the size in the second embodiment is P×9, and the size in the comparative example is P×15.

As described above, when the number n of stacked layers is 4 or more, the layer select transistor in the second embodiment is smaller than the layer select transistor in the comparative example, and the difference therebetween increases with the increase in the number n of stacked layers.

The configuration and the manufacturing method are the same as those of the semiconductor device according to the first embodiment in other respects, and are therefore not described here.

The second embodiment can also be modified as in the first modification (FIG. 12 and FIG. 13) and the second modification (FIG. 14 and FIG. 15) of the first embodiment.

As described above, according to the second embodiment, one of the semiconductor layers stacked on the semiconductor substrate can be correctly selected even if design rules are reduced, as in the first embodiment.

Third Embodiment

FIG. 18 shows a semiconductor device according to the third embodiment. FIG. 19 is a sectional view taken along the line XIX-XIX in FIG. 18.

In the third embodiment, the number n of stacked semiconductor layers is 3, the expansion amount j of normally-on regions on one side is 1(k=j=1), and the number m(=n+k) of gate electrodes is 4.

Semiconductor substrate 10 is, for example, a silicon substrate. Insulating layer 11 is disposed on semiconductor substrate 10. First, second, and third semiconductor layers 12-1, 12-2, and 12-3 are stacked in an insulated state from the surface of insulating layer 11 in order in a first direction perpendicular to the surface of insulating layer 11, and extend in a second direction parallel to the surface of insulating layer 11.

In this embodiment, first, second, and third semiconductor layers 12-1, 12-2, and 12-3 are insulated from one another by insulating layer 13. Insulating layer 14 is disposed on third semiconductor layer 12-3 as an uppermost layer. Insulating layers 13 and 14 are, for example, silicon oxide layers. Insulating layer 14 can be a silicon nitride layer, or a stacked layer of a silicon oxide layer and a silicon nitride layer, instead of the silicon oxide layer.

First, second, and third semiconductor layers 12-1, 12-2, and 12-3 and insulating layers 13 and 14 have a stepped shape at one end in the second direction. One end (stepped part) of first, second, and third semiconductor layers 12-1, 12-2, and 12-3 in the second direction is covered by first, second, and third diffusion prevention layers 20-1, 20-2, and 20-3.

First, second, and third diffusion prevention layers 20-1, 20-2, and 20-3 comprise insulating layers having a thickness that allows the passage of an FN tunnel current or a direct tunnel current, for example, a thickness of 1 nm or less. In this case, first, second, and third diffusion prevention layers 20-1, 20-2, and 20-3 are preferably formed by, for example, silicon oxide layers, silicon nitride layers, or silicon oxynitride layers.

First, second, and third diffusion prevention layers 20-1, 20-2, and 20-3 may comprise conductive layers, for example, metal layers, or conductive metal compound layers such as metal nitride layers, metal silicide layers. In this case, first, second, and third diffusion prevention layers 20-1, 20-2, and 20-3 are low in resistance, and the wiring resistance between common electrode 18 and first, second, and third semiconductor layers 12-1, 12-2, and 12-3 can therefore be reduced.

Common semiconductor layer 21 is disposed at one end of first, second, and third semiconductor layers 12-1, 12-2, and 12-3 and insulating layers 13 and 14 in the second direction, and is connected in common to first, second, and third semiconductor layers 12-1, 12-2, and 12-3 via first, second, and third diffusion prevention layers 20-1, 20-2, and 20-3.

First, second, and third semiconductor layers 12-1, 12-2, and 12-3, insulating layers 13 and 14, and common semiconductor layer 21 constitute fin-type stacked layer structure Fin. First, second, and third semiconductor layers 12-1, 12-2, and 12-3 are preferably monocrystalline, but may be polycrystalline or amorphous.

At one end of fin-type stacked layer structure Fin in the second direction, common electrode 18 is connected to common semiconductor layer 21. Common electrode 18 comprises a metal layer of, for example, tungsten or aluminum.

Layer select transistor 15 (LST) is, for example, an FET. Layer select transistor 15 (LST) uses first, second, and third semiconductor layers 12-1, 12-2, and 12-3 or common semiconductor layer 21 as a channel, and selects one of first, second, and third semiconductor layers 12-1, 12-2, and 12-3.

Layer select transistor 15 (LST) has first, second, third, and fourth gate electrodes 16-1, 16-2, 16-3, and 16-4 arranged in order from the side of common electrode 18 with constant pitch P in the second direction.

First, second, third, and fourth gate electrodes 16-1, 16-2, 16-3, and 16-4 comprise metal silicide layers such as conductive polysilicon layers and nickel silicide layers, or stacks of these layers.

First, second, third, and fourth gate electrodes 16-1, 16-2, 16-3, and 16-4 extend in the first direction along at least the side surfaces of first, second, and third semiconductor layers 12-1, 12-2, and 12-3 and common semiconductor layer 21 located in a third direction perpendicular to the first and second directions.

In this embodiment, first, second, third, and fourth gate electrodes 16-1, 16-2, 16-3, and 16-4 cover the upper surface of fin-type stacked layer structure Fin in the first direction and the two side surfaces thereof in the second direction. That is, layer select transistor 15 (LST) is a fin-type FET having a double gate structure.

First gate electrode 16-1 is disposed between first diffusion prevention layer 20-1 and second diffusion prevention layer 20-2, and second gate electrode 16-2 is disposed between second diffusion prevention layer 20-2 and third diffusion prevention layer 20-3. Third and fourth gate electrodes 16-3 and 16-4 are disposed closer to first, second, and third semiconductor layers 12-1, 12-2, and 12-3 than third diffusion prevention layer 20-3.

Layer select transistor 15 (LST) has first, second, and third normally-on regions 17-1, 17-2, and 17-3 in first, second, and third semiconductor layers 12-1, 12-2, and 12-3, respectively.

First, second, and third normally-on regions 17-1, 17-2, and 17-3 are impurity regions including an n-type impurity (a pentad such as arsenic or phosphorus), a p-type impurity (a triad such as boron or indium), or both of the above.

First normally-on region 17-1 present in first semiconductor layer 12-1 sets channels adjacent to first and second gate electrodes 16-1 and 16-2 to normally-on channels that are not dependent on the potentials of first and second gate electrodes 16-1 and 16-2.

Second normally-on region 17-2 present in second semiconductor layer 12-2 sets channels adjacent to second and third gate electrodes 16-2 and 16-3 to normally-on channels that are not dependent on the potentials of second and third gate electrodes 16-2 and 16-3.

Third normally-on region 17-3 present in third semiconductor layer 12-3 sets channels adjacent to third and fourth gate electrodes 16-3 and 16-4 to normally-on channels that are not dependent on the potentials of third and fourth gate electrodes 16-3 and 16-4.

Although layer select transistor 15 (LST) is an FET in the case described according to this embodiment, other switch elements can be used as layer select transistors. That is, layer select transistor 15 (LST) has only to have a switch function.

In the example shown according to this embodiment, first, second, and third normally-on regions 17-1, 17-2, and 17-3 are only formed in first, second, and third semiconductor layers 12-1, 12-2, and 12-3. However, impurity regions for controlling the threshold of layer select transistor 15 (LST) may be additionally provided in first, second, and third semiconductor layers 12-1, 12-2, and 12-3.

Table 3 shows a semiconductor layer selecting operation in the semiconductor device shown in FIG. 18.

TABLE 3

| Selected semiconductor layer | Gate potential of layer-select-transistor | | | |
|---|---|---|---|---|
| | 16-1 | 16-2 | 16-3 | 16-4 |
| 12-3 | H | H | L | L |
| 12-2 | H | L | L | H |
| 12-1 | L | L | H | H |

According to the semiconductor device shown in FIG. 18, layer select transistor 15 (LST) associated with first gate electrode 16-1 is normally on (normally-on state) in first semiconductor layer 12-1 as a lowermost layer, and functions as a switch element in other second and third semiconductor layers 12-2 and 12-3.

Layer select transistor 15 (LST) associated with second gate electrode 16-2 is normally on (normally-on state) in first semiconductor layer 12-1 as the lowermost layer and in second semiconductor layer 12-2 as an interlayer, and functions as a switch element in other third semiconductor layer 12-3.

Layer select transistor 15 (LST) associated with third gate electrode 16-3 is normally on (normally-on state) in second semiconductor layer 12-2 as the interlayer and in third semiconductor layer 12-3 as the uppermost layer, and functions as a switch element in other first semiconductor layer 12-1.

Layer select transistor 15 (LST) associated with fourth gate electrode 16-4 is normally on (normally-on state) in third semiconductor layer 12-3 as the uppermost layer, and functions as a switch element in other first and second semiconductor layers 12-1 and 12-2.

Therefore, by setting the potentials of first, second, third, and fourth gate electrodes 16-1, 16-2, 16-3, and 16-4 to the relation shown in Table 3, one of first, second, and third semiconductor layers 12-1, 12-2, and 12-3 can be selected.

In Table 3, "H" refers to an on-potential that can set the channel of layer select transistor 15 (LST) to an on-channel (on-state), and "L" refers to an off-potential that can set the channel of layer select transistor 15 (LST) to an off-channel (off-state).

For example, when layer select transistor 15 (LST) is an n-channel FET, "H" is a positive potential and "L" is a ground potential. When layer select transistor 15 (LST) is a p-channel FET, "H" is a negative potential and "L" is a ground potential.

When first semiconductor layer 12-1 is selected, the potentials of first and second gate electrodes 16-1 and 16-2 are set to "L", and the potentials of third and fourth gate electrodes 16-3 and 16-4 are set to "H".

At the same time, layer select transistor 15 (LST) associated with first gate electrode 16-1 is off in second and third semiconductor layers 12-2 and 12-3, and layer select transistor 15 (LST) associated with second gate electrode 16-2 is off in third semiconductor layer 12-3, so that second and third semiconductor layers 12-2 and 12-3 are not selected. On the contrary, in first semiconductor layer 12-1, first normally-on region 17-1 is present, and all the channels adjacent to first to fourth gate electrodes 16-1 to 16-4 are therefore on.

Accordingly, first semiconductor layer 12-1 is selected.

When second semiconductor layer 12-2 is selected, the potentials of second and third gate electrodes 16-2 and 16-3 are set to "L", and the potentials of first and fourth gate electrodes 16-1 and 16-4 are set to "H".

At the same time, layer select transistor 15 (LST) associated with second gate electrode 16-2 is off in third semiconductor layer 12-3, and layer select transistor 15 (LST) associated with third gate electrode 16-3 is off in first semiconductor layer 12-1, so that first and third semiconductor layers 12-1 and 12-3 are not selected. On the contrary, in second semiconductor layer 12-2, second normally-on region 17-2 is present, and all the channels adjacent to first to fourth gate electrodes 16-1 to 16-9 are therefore on.

Accordingly, second semiconductor layer 12-2 is selected.

When third semiconductor layer 12-3 is selected, the potentials of third and fourth gate electrodes 16-3 and 16-4 are set to "L", and the potentials of first and second gate electrodes 16-1 and 16-2 are set to "H".

At the same time, layer select transistor 15 (LST) associated with third gate electrode 16-3 is off in first semiconductor layer 12-1, and layer select transistor 15 (LST) associated with fourth gate electrode 16-4 is off in first and second semiconductor layers 12-1 and 12-2, so that first and second semiconductor layers 12-1 and 12-2 are not selected. On the contrary, in third semiconductor layer 12-3, third normally-on region 17-3 is present, and all the channels adjacent to first to fourth gate electrodes 16-1 to 16-4 are therefore on.

Accordingly, third semiconductor layer 12-3 is selected.

Owing the selecting operation described above, common electrode 18 connected in common to first, second, and third semiconductor layers 12-1, 12-2, and 12-3 has only to be provided for first, second, and third semiconductor layers 12-1, 12-2, and 12-3. That is, as it is not necessary to independently provide an electrode for each of first, second, and third semiconductor layers 12-1, 12-2, and 12-3, the size of a contact region can be reduced.

FIG. 20 shows the relation between the number of stacked semiconductor layers and the size of the layer select transistor.

In this embodiment, the number n of stacked semiconductor layers is 3.

(a) in FIG. 20 corresponds to the third embodiment shown in FIG. 18. In the third embodiment, the size of layer select transistor 15 (LST) in the second direction is P×3. Note that P is the pitch of gate electrodes 16-1 to 16-4.

(b) in FIG. 18 shows a comparative example. In the comparative example, the pitch of the gate electrodes is set to 2P so that the number of stacked semiconductor layers 12-1 to 12-3 is equal to the number of gate electrodes 16-1 to 16-3 and so that the semiconductor layer selecting function is effective.

In the comparative example, the size of layer select transistor 15 (LST) in the second direction is P×4.

Thus, when the number n of stacked semiconductor layers is 3, layer select transistor 15 (LST) according to the third embodiment is smaller than layer select transistor 15 (LST) according to the comparative example.

In the third embodiment, when the number n of stacked semiconductor layers is 2, the size of layer select transistor 15 (LST) according to the third embodiment is equal to the size of layer select transistor 15 (LST) according to the comparative example.

This embodiment also has the advantageous effect that allows the size of the layer select transistor to be smaller than the size of the layer select transistor according to the comparative example when the number n of stacked semiconductor layers is 3 or more. This advantageous effect is greater when the number n of stacked semiconductor layers is larger. The third embodiment therefore provides a highly effective technique when there is a demand for a largest possible number of stacked layers.

The relation between the number of stacked semiconductor layers and the size of the layer select transistor is generalized as follows.

In the third embodiment ((a) in FIG. 20), the size of the layer select transistor in the second direction is $P×(n+k-1)$ when the number of stacked layers is n. In the third embodiment, $k=1$, so that the size of the layer select transistor in the second direction is $P×n$. In contrast, according to the comparative example ((b) in FIG. 20), the size of the layer select transistor in the second direction is $P×(n-1)×2$ when the number of stacked layers is n.

For example, when the number n of stacked layers is 2, the size in the third embodiment is P×2, and the size in the comparative example is P×2, and the size of the layer select transistor in the third embodiment is equal to the size of the layer select transistor in the comparative example.

However, when the number n of stacked layers is 3, the size in the third embodiment is P×3, and the size in the comparative example is P×4. When the number n of stacked layers is 4, the size in the third embodiment is P×4, and the size in the comparative example is P×6. When the number n of stacked layers is 5, the size in the third embodiment is P×5, and the size in the comparative example is P×8. When the number n of stacked layers is 6, the size in the third embodiment is P×6, and the size in the comparative example is P×10.

As described above, when the number n of stacked layers is 3 or more, the layer select transistor in the third embodiment is smaller than the layer select transistor in the comparative example, and the difference therebetween increases with the increase in the number n of stacked layers.

FIG. 21 to FIG. 28 show a method of manufacturing the semiconductor device shown in FIG. 18.

Figure 21:
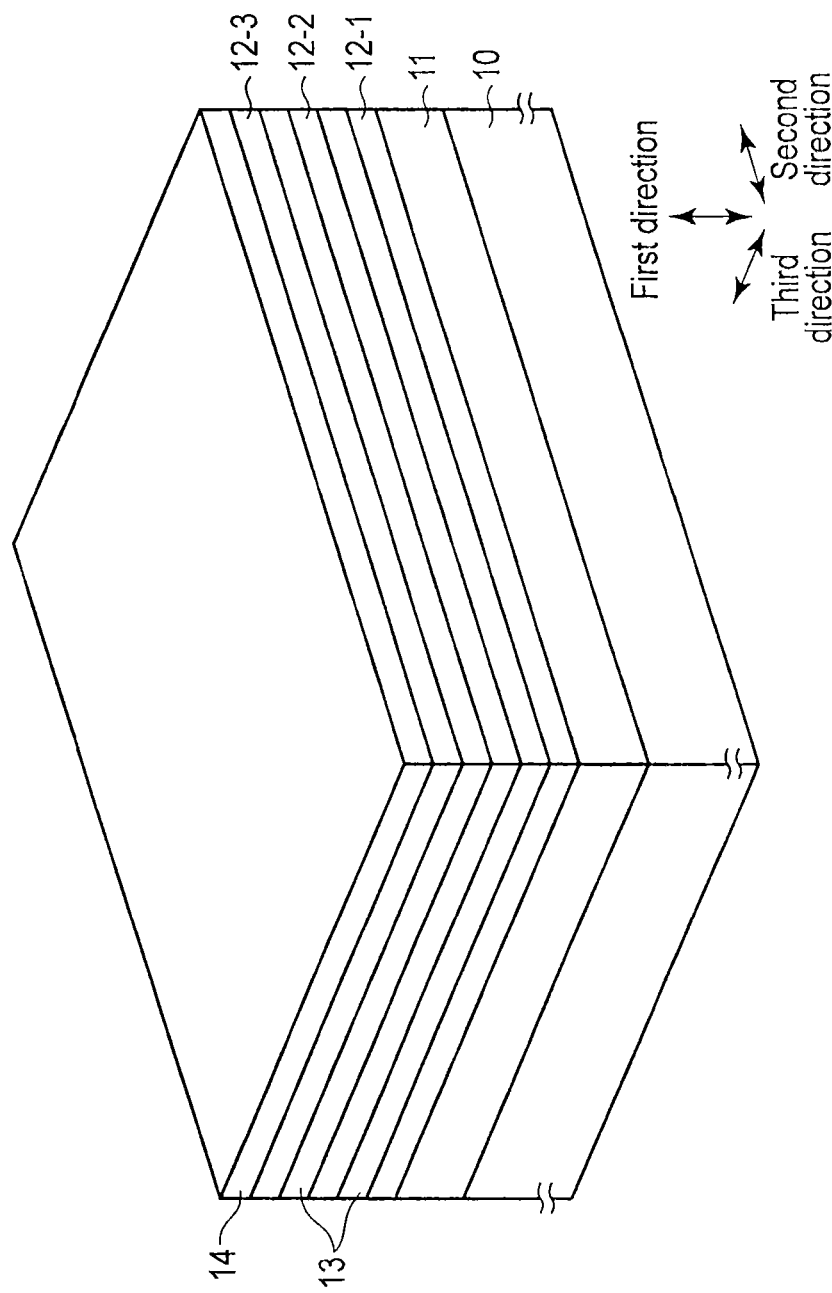

First, as shown in FIG. 21, a p-type silicon substrate, for example, having a plane direction (100) and a specific resistance of 10 to 20 Ωcm is prepared as semiconductor substrate 10. On this semiconductor substrate 10, silicon oxide layers as insulating layers 11 and 13, and 14 and polycrystalline silicon layers as first, second, and third semiconductor layers 12-1, 12-2, and 12-3 are alternately formed.

As shown in FIG. 22, a stepped shape is then formed at the end of first, second, and third semiconductor layers 12-1, 12-2, and 12-3 and insulating layers 13 and 14 in the second direction, for example, by PEP and RIE.

As shown in FIG. 23, mask layer (photoresist layer) 22 is then formed on insulating layer 14, for example, by PEP. Mask layer 22 is used as a mask to form first, second, and third normally-on regions 17-1, 17-2, and 17-3 in first, second, and third semiconductor layers 12-1, 12-2, and 12-3 by ion implantation.

In this case, first, second, and third normally-on regions 17-1, 17-2, and 17-3 are formed at the same time. The ion implantation is conducted by implanting, for example, arsenic ions into first, second, and third semiconductor layers 12-1, 12-2, and 12-3 at a predetermined accelerating voltage.

In this embodiment, first, second, and third normally-on regions 17-1, 17-2, and 17-3 are formed after the stepped shape has been formed.

Instead, after first, second, and third semiconductor layers 12-1, 12-2, and 12-3 have been formed, first, second, and third normally-on regions 17-1, 17-2, and 17-3 may be formed by PEP and ion implantation before the formation of the stepped shape.

Alternatively, first normally-on region 17-1 may be formed immediately after first semiconductor layer 12-1 has been formed, and second normally-on region 17-2 may be then formed immediately after second semiconductor layer 12-2 has been formed, and moreover, third normally-on region 17-3 may be then formed immediately after third semiconductor layer 12-3 has been formed.

As shown in FIG. 24, first, second, and third diffusion prevention layers 20-1, 20-2, and 20-3 are then formed on the side surfaces (stepped parts) of first, second, and third semiconductor layers 12-1, 12-2, and 12-3 in the second direction.

When first, second, and third diffusion prevention layers 20-1, 20-2, and 20-3 are insulating layers, first, second, and third diffusion prevention layers 20-1, 20-2, and 20-3 may be actively formed, for example, by thermal oxidation, or may use, for example, native oxide films formed by the contact with oxygen in a wafer process.

When first, second, and third diffusion prevention layers 20-1, 20-2, and 20-3 are metal silicide layers, first, second, and third diffusion prevention layers 20-1, 20-2, and 20-3 use a silicide reaction between the metal layer and first, second, and third semiconductor layers 12-1, 12-2, and 12-3.

In this embodiment, first, second, and third diffusion prevention layers 20-1, 20-2, and 20-3 are formed after first, second, and third normally-on regions 17-1, 17-2, and 17-3 have been formed. Instead, first, second, and third diffusion prevention layers 20-1, 20-2, and 20-3 may be formed before first, second, and third normally-on regions 17-1, 17-2, and 17-3 are formed.

As shown in FIG. 25, common semiconductor layer 21 connected to first, second, and third semiconductor layers 12-1, 12-2, and 12-3 via first, second, and third diffusion prevention layers 20-1, 20-2, and 20-3 is then formed on insulating layer 11.

Common semiconductor layer 21 preferably has the same material and the same crystal structure as first, second, and third semiconductor layers 12-1, 12-2, and 12-3. The upper surface of common semiconductor layer 21 is preferably planarized by CMP.

Figure 26:
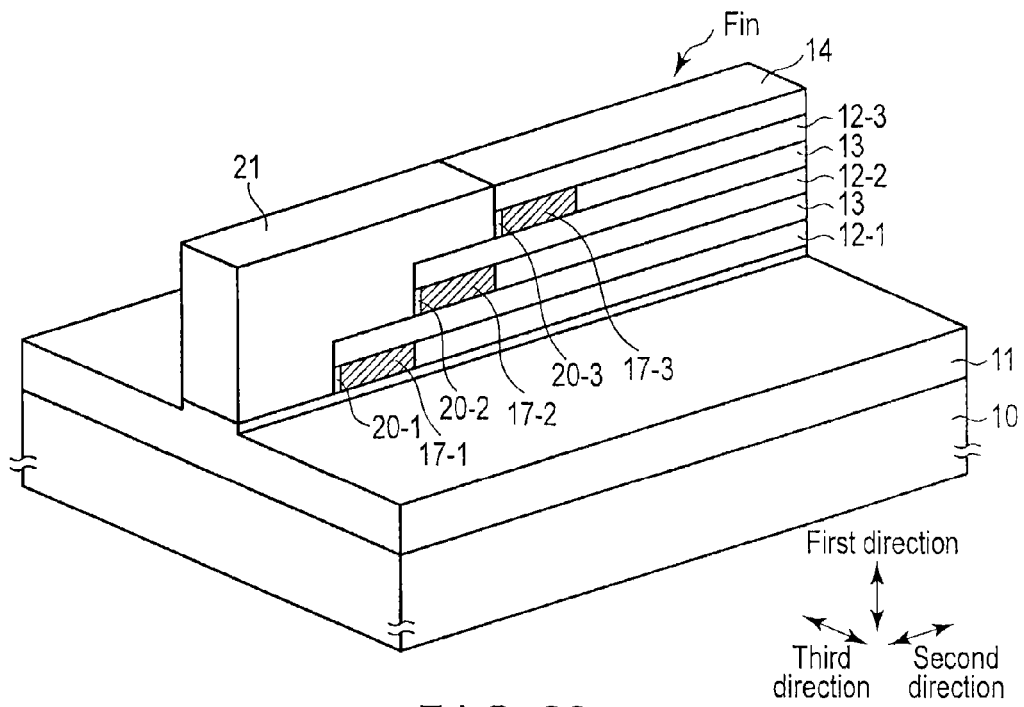

As shown in FIG. 26, insulating layers 13 and 11, first, second, and third semiconductor layers 12-1, 12-2, and 12-3, and common semiconductor layer 21 are then patterned by PEP and RIE to form fin-type stacked layer structure Fin.

Figure 27:
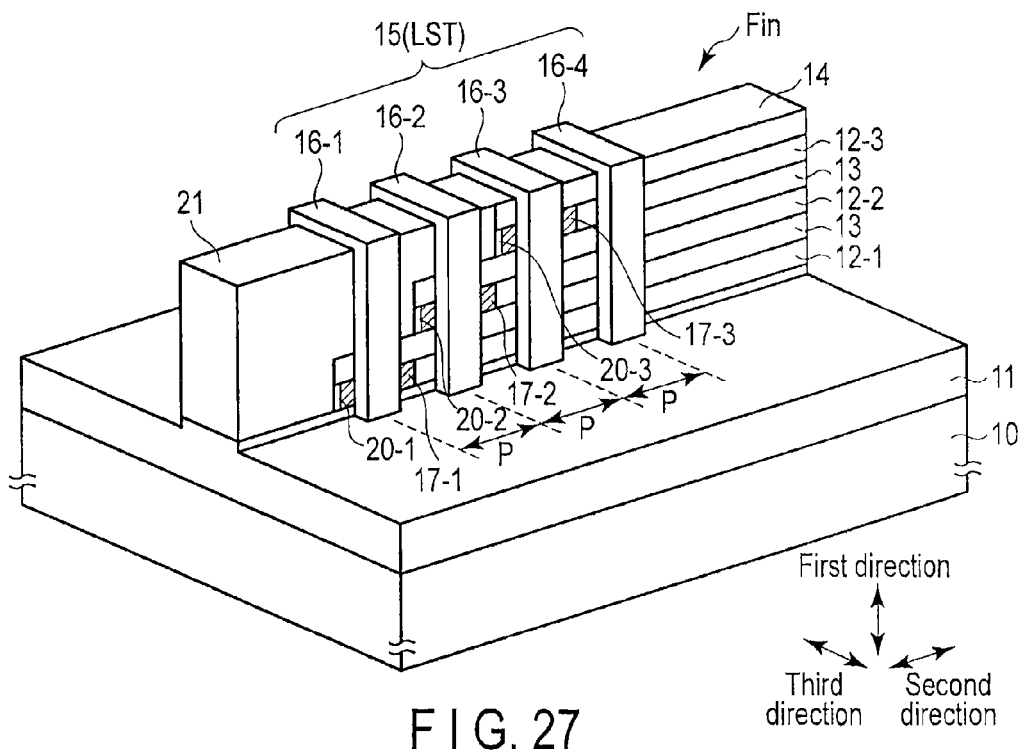

As shown in FIG. 27, a gate insulating layer (e.g. a silicon oxide layer) covering fin-type stacked layer structure Fin, and a conductive layer on the gate insulating layer are then formed on insulating layer 11. This conductive layer is patterned by PEP and RIE to form first, second, third, and fourth gate electrodes 16-1, 16-2, 16-3, and 16-4 arranged with constant pitch P in the second direction.

First, second, third, and fourth gate electrodes 16-1, 16-2, 16-3, and 16-4 are formed to cover the upper surface of fin-type stacked layer structure Fin in the first direction and the two side surfaces thereof in the second direction.

At this point, first normally-on region 17-1 is only formed in the channel adjacent to first gate electrode 16-1, second normally-on region 17-2 is only formed in the channel adjacent to second gate electrode 16-2, and third normally-on region 17-3 is only formed in the channel adjacent to third gate electrode 16-3.

After the gate insulating layer and the conductive layer have been formed, the upper surface of the conductive layer may be planarized by CMP before the formation of first, second, third, and fourth gate electrodes 16-1, 16-2, 16-3, and 16-4.

The CMP may be conducted with an insulating layer filling regions other than fin-type stacked layer structure Fin. In this case, the insulating layer filling the regions other than fin-type stacked layer structure Fin is removed after the CMP, and first, second, third, and fourth gate electrodes 16-1, 16-2, 16-3, and 16-4 are then formed by PEP and RIE.

As shown in FIG. 28, common electrode 18 connected in common to first, second, and third semiconductor layers 12-1, 12-2, and 12-3 is then formed at one end of fin-type stacked layer structure Fin in the second direction.

First, second, and third normally-on regions 17-1, 17-2, and 17-3 expand in the second direction as a result of a high-temperature heat treatment such as a baking treatment, a curing treatment, or a densifying treatment conducted after the formation of the normally-on regions.

In this embodiment, first, second, and third normally-on regions 17-1, 17-2, and 17-3 expand one time or more or less than two times pitch P of first, second, third, and fourth gate electrodes 16-1, 16-2, 16-3, and 16-4.

However, it is assumed that the end of first normally-on region 17-1 in the second direction before the diffusion of the impurity corresponds to the end of first gate electrode 16-1 in the second direction, the end of second normally-on region 17-2 in the second direction before the diffusion of the impurity corresponds to the end of second gate electrode 16-2 in the second direction, and the end of third normally-on region 17-3 in the second direction before the diffusion of the impurity corresponds to the end of third gate electrode 16-3 in the second direction.

The semiconductor device shown in FIG. 18 is completed by the process described above.

FIG. 29 shows a first modification of the third embodiment. FIG. 30 is a sectional view taken along the line XXX-XXX in FIG. 29.

The first modification is characterized in that low-resistance region 19 having a resistance value lower than the resistance values of first, second, and third semiconductor layers 12-1, 12-2, and 12-3 is provided in regions that are not covered by first, second, third, and fourth gate electrodes 16-1, 16-2, 16-3, and 16-4 in the side surfaces of first, second, and third semiconductor layers 12-1, 12-2, and 12-3 in the third direction, in contrast with the third embodiment.

The configuration is the same as that of the semiconductor device according to the third embodiment in other respects, and is therefore not described here.

Low-resistance region 19 is, for example, an impurity region different from first, second, and third normally-on regions 17-1, 17-2, and 17-3. In this case, the impurity in low-resistance region 19 may be the same as or different from the impurity in first, second, and third normally-on regions 17-1, 17-2, and 17-3.

Otherwise, low-resistance region 19 is a metal silicide layer such as a nickel silicide layer. In this case, low-resistance region 19 is formed by, after a metal layer covering fin-type stacked layer structure Fin has been formed, causing a silicide reaction between the metal layer and first, second, and third semiconductor layers 12-1, 12-2, and 12-3 and then removing the unreacted metal layer.

According to this modification, parasitic resistance is reduced by low-resistance region 19, and memory characteristics such as the operation speed can be improved.

FIG. 31 shows a second modification of the third embodiment. FIG. 32 is a sectional view taken along the line XXXII-XXXII in FIG. 31.

The second modification is characterized in that the spaces between first, second, and third semiconductor layers 12-1, 12-2, and 12-3 are cavities and the spaces between first, second, third, and fourth gate electrodes 16-1, 16-2, 16-3, and 16-4 and fin-type stacked layer structure Fin are cavities, in contrast with the third embodiment.

The configuration is the same as that of the semiconductor device according to the third embodiment in other respects, and is therefore not described here.

The cavities are formed by selectively removing insulating layers 13 and 14 shown in FIG. 18 and FIG. 19 after the structure shown in the third embodiment (FIG. 18 and FIG. 19) has been formed. In this case, first, second, and third semiconductor layers 12-1, 12-2, and 12-3 are supported by first, second, third, and fourth gate electrodes 16-1, 16-2, 16-3, and 16-4.

According to this modification, the performance of insulation of the semiconductor layers can be improved by forming the cavities in the insulating regions, so that the reliability of a memory element is improved.

As described above, according to the third embodiment and the modifications thereof, one of the semiconductor layers stacked on the semiconductor substrate can be correctly selected even if design rules are reduced.

Fourth Embodiment

Figure 33:
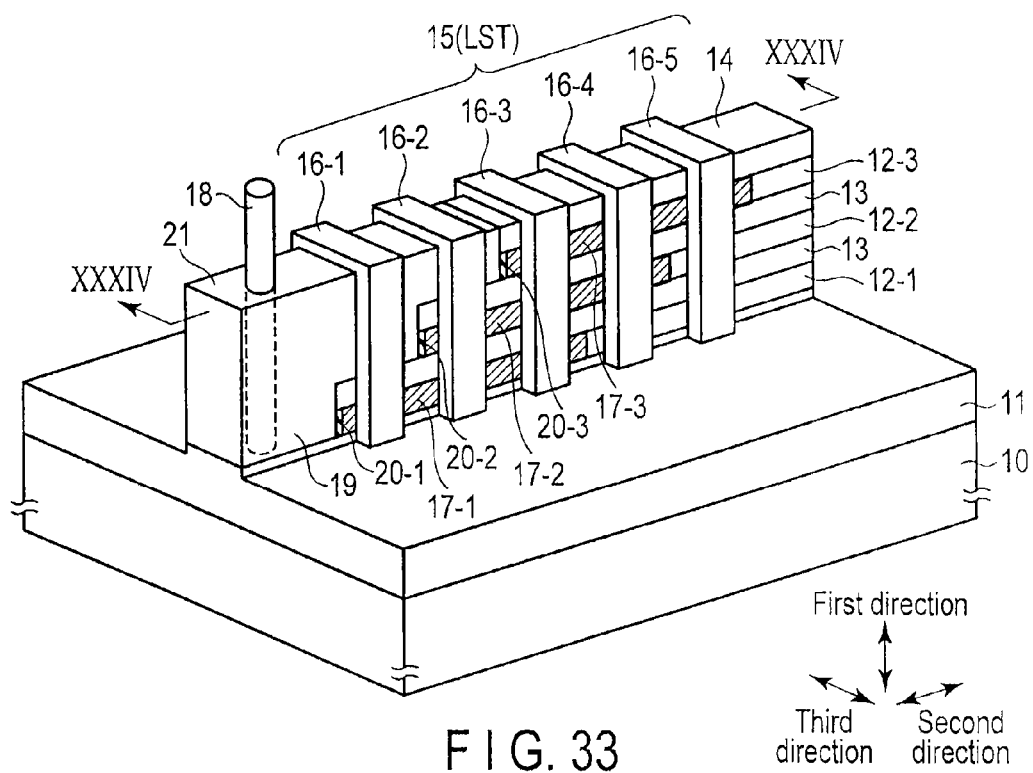
FIG. 33 is a perspective view showing a semiconductor device of a fourth embodiment.
Figure 34:
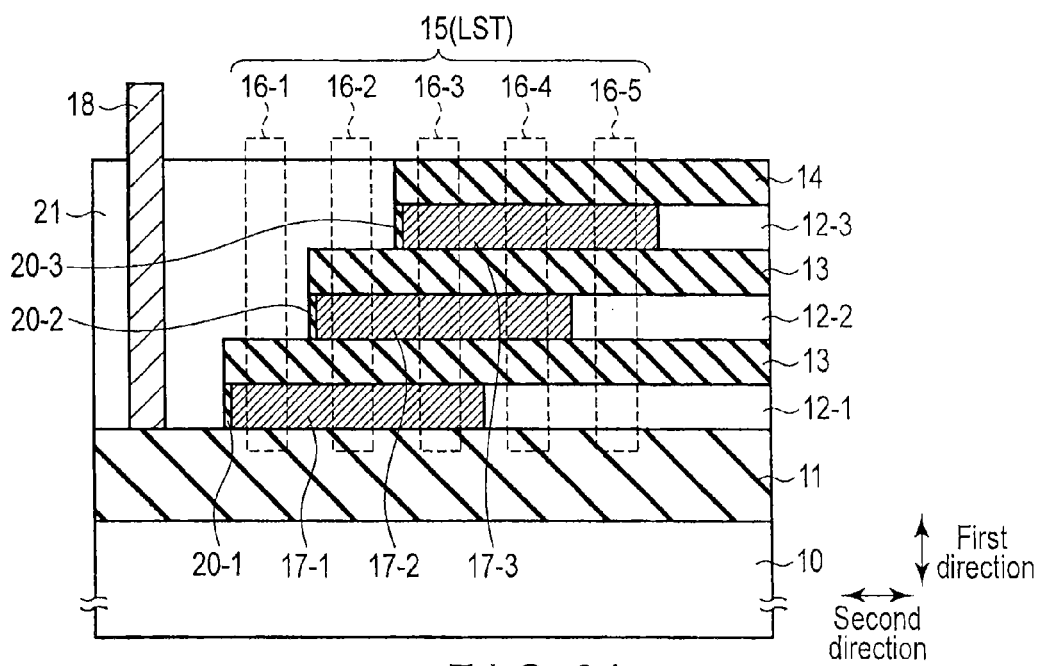
FIG. 34 is a sectional view taken along line XXXIV-XXXIV in FIG. 33.

FIG. 33 shows a semiconductor device according to the fourth embodiment. FIG. 34 is a sectional view taken along the line XXXIV-XXXIV in FIG. 33.

In the fourth embodiment, the number n of stacked semiconductor layers is 3, the expansion amount j of normally-on regions on one side is 2(k=j=2), and the number m(=n+k) of gate electrodes is 5.

The expansion amounts of first, second, and third normally-on regions 17-1, 17-2, and 17-3 in the second direction depend on, for example, the temperature and time (sum) of a high-temperature heat treatment (e.g. a baking treatment, a curing treatment, or a densifying treatment) conducted after the formation of the normally-on regions.

As has already been described, for example, according to experimental data, when a polycrystalline silicon layer is used as a semiconductor layer and a normally-on region is formed by adding arsenic (As), arsenic is diffused about 70 nm in the polycrystalline silicon layer by a heat treatment at 1000° C. for 10 seconds. Arsenic is diffused about 160 nm in the polycrystalline silicon layer by a heat treatment at 1000° C. for 20 seconds.

Thus, in the case described according to the fourth embodiment, the expansion amounts of first, second, and third normally-on regions 17-1, 17-2, and 17-3 are greater than in the third embodiment. More specifically, first, second, and third normally-on regions 17-1, 17-2, and 17-3 expand two times pitch P of gate electrodes.

In this case, first, second, third, fourth, and fifth gate electrodes 16-1, 16-2, 16-3, 16-4, and 16-5 are arranged with constant pitch P in the second direction.

First normally-on region 17-1 sets channels adjacent to first, second, and third gate electrodes 16-1, 16-2, and 16-3 to be normally on in first semiconductor layer 12-1.

Second normally-on region 17-2 sets channels adjacent to second, third, and fourth gate electrodes 16-2, 16-3, and 16-4 to be normally on in second semiconductor layer 12-2.

Third normally-on region 17-3 sets channels adjacent to third, fourth, and fifth gate electrodes 16-3, 16-4, and 16-5 to be normally on in third semiconductor layer 12-3.

Here, the relation between the number of stacked semiconductor layers and the size of a layer select transistor is generalized as in the third embodiment as follows.

In the fourth embodiment as well, the size of the layer select transistor in the second direction is $P\times(n+k-1)$ when the number of stacked layers is n. In the fourth embodiment, $k=2$, so that the size of the layer select transistor in the second direction is $P\times(n+1)$. In contrast, according to a comparative example (wherein the pitch of gate electrodes 16-1, 16-2, and 16-3 in (b) in FIG. 20 is changed from $P\times2$ to $P\times3$), the size of the layer select transistor in the second direction is $P\times(n-1)\times3$ when the number of stacked layers is n.

For example, when the number n of stacked layers is 2, the size in the fourth embodiment is $P\times3$, and the size in the comparative example is $P\times3$, and the size of the layer select transistor in the fourth embodiment is equal to the size of the layer select transistor in the comparative example.

When the number n of stacked layers is 3, the size in the fourth embodiment is $P\times4$, and the size in the comparative example is $P\times6$. When the number n of stacked layers is 4, the size in the fourth embodiment is $P\times5$, and the size in the comparative example is $P\times9$. When the number n of stacked layers is 5, the size in the fourth embodiment is $P\times6$, and the size in the comparative example is $P\times12$. When the number n of stacked layers is 6, the size in the fourth embodiment is $P\times7$, and the size in the comparative example is $P\times15$.

As described above, when the number n of stacked layers is 3 or more, the layer select transistor in the fourth embodiment is smaller than the layer select transistor in the comparative example, and the difference therebetween increases with the increase in the number n of stacked layers.

The configuration and the manufacturing method are the same as those of the semiconductor device according to the third embodiment in other respects, and are therefore not described here.

The fourth embodiment can also be modified as in the first modification (FIG. 29 and FIG. 30) and the second modification (FIG. 31 and FIG. 32) of the third embodiment.

As described above, according to the fourth embodiment, one of the semiconductor layers stacked on the semiconductor substrate can be correctly selected even if design rules are reduced, as in the third embodiment.

In the third and fourth embodiments, the normally-on regions only expand (impurity diffusion) on one side owing to the diffusion prevention layers provided in the stepped parts. Therefore, as apparent from the explanation of the size of the layer select transistor, the third and fourth embodiments are more advantageous than the first and second embodiments regarding the reduction of the size of the layer select transistor.

As apparent from the comparison with the comparative example, the size of the layer select transistor is more reduced in the first and second embodiments than in the comparative example when the number n of stacked layers is 4 or more. In contrast, the size of the layer select transistor is more reduced in the third and fourth embodiments than in the comparative example when the number n of stacked layers is 3 or more.

Application Example

An application example of the semiconductor device according to the embodiments is described.

The application example described below concerns three-dimensional nonvolatile semiconductor memory having memory cells connected to first to n-th semiconductor layers (n is a natural number equal to or more than 2). The technique according to the embodiment enables a high capacity memory to be obtained by selecting one of first to n-th semiconductor layers.

Figure 35:
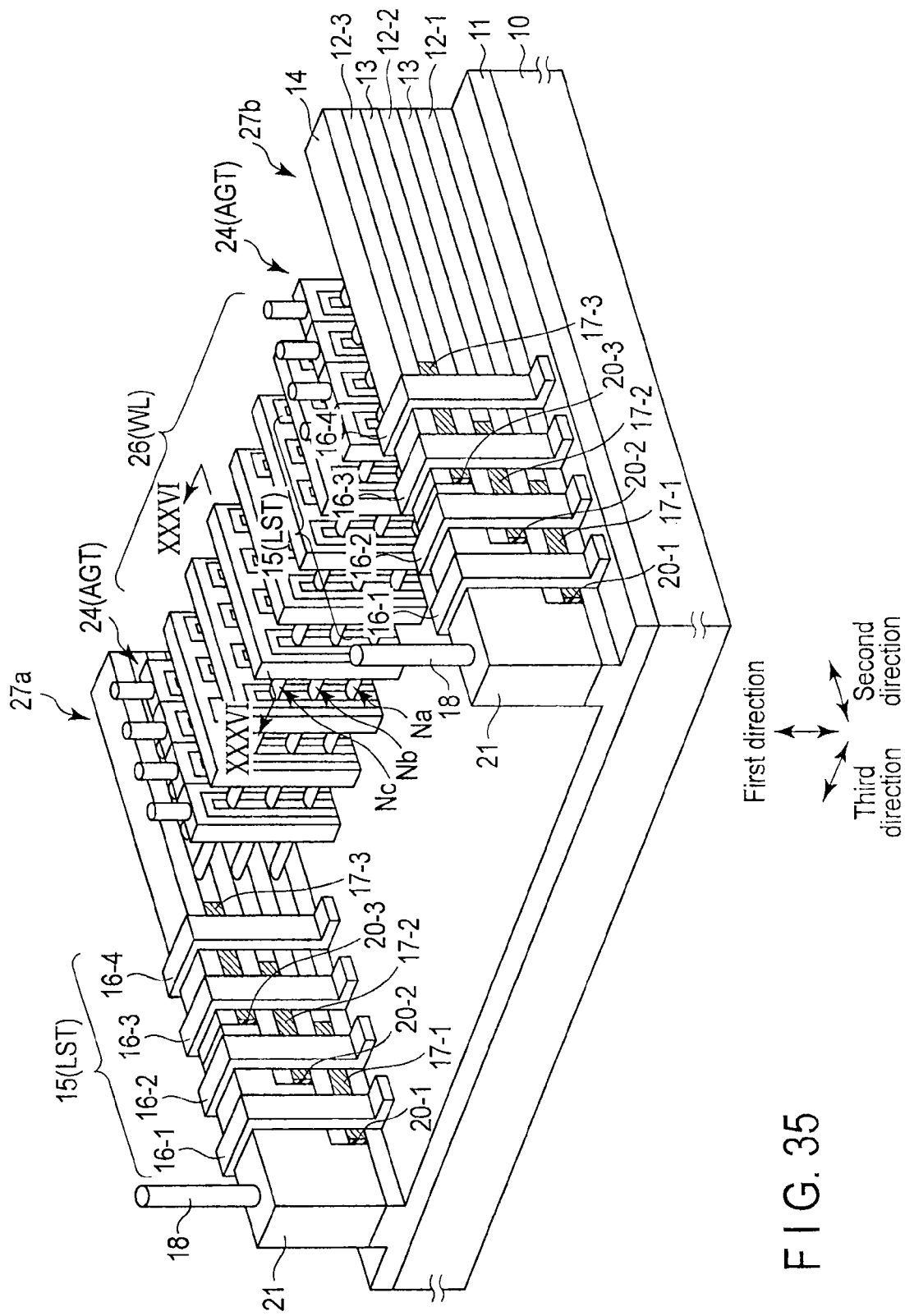
FIG. 35 is a perspective view showing a nonvolatile semiconductor memory of an application example.

FIG. 35 shows a VLB as the application example. FIG. 36 is a sectional view taken along the line XXXVI-XXXVI in FIG. 35. FIG. 37 shows memory cell MC in FIG. 36.

First, second, and third memory strings Na, Nb, and Nc which are stacked in the first direction and which extend in the third direction are arranged on insulating layer 11 disposed on semiconductor substrate 10. The number of memory strings is three in this example, but is not limited thereto. That is, the number of memory strings stacked in the first direction has only to be two or more.

First, second, and third memory strings Na, Nb, and Nc comprise first, second, and third semiconductor layers 12-1, 12-2, and 12-3 stacked in the first direction, and memory cells MC connected in series in the third direction. The number of memory cells MC connected in series is six in this example, but is not limited thereto. That is, the number of memory cells MC connected in series in the third direction has only to be two or more.

First, second, and third semiconductor layers 12-1, 12-2, and 12-3 are insulated from one another by insulating layer 13. Insulating layer 14 is disposed on third semiconductor layer 12-3 as an uppermost layer.

For example, as shown in FIG. 37, each memory cell MC comprises insulating layer (gate insulating layer 25-1, recoding layer 25-2, and block insulating layer 25-3) 25 disposed on the side surfaces of first, second, and third semiconductor layers 12-1, 12-2, and 12-3 in the second direction, and gate electrode (e.g. word line WL) 26 disposed on the side of insulating layer 25 opposite to first, second, and third semiconductor layers 12-1, 12-2, and 12-3.

Gate electrode 26 extends in the first direction along the side surfaces of first, second, and third semiconductor layers 12-1, 12-2, and 12-3 in the second direction. When viewed from the upper surface, gate electrode 26 (WL) extends in the second direction over first, second, and third memory strings Na, Nb, and Nc.

Beams 27a and 27b extending in the second direction are connected to both ends of first, second, and third memory strings Na, Nb, and Nc in the third direction.

When first, second, and third memory strings Na, Nb, and Nc have a fin-type stacked layer structure which comprises first, second, and third semiconductor layers 12-1, 12-2, and 12-3 and insulating layers 13 and 14, beams 27a and 27b also have a fin-type stacked layer structure which comprises first, second, and third semiconductor layers 12-1, 12-2, and 12-3 and insulating layers 13 and 14.

Beams 27a and 27b serve as conductive paths to supply a voltage or a current to channels of first, second, and third memory strings Na, Nb, and Nc.

Beams 27a and 27b function to fix first, second, and third memory strings Na, Nb, and Nc and prevent the collapse of these memory strings. The width of each of beams 27a and 27b in the third direction is preferably greater than the width of each of first, second, and third memory strings Na, Nb, and Nc in the second direction.

The semiconductor device according to the embodiments, that is, a function to select one of first, second, and third semiconductor layers 12-1, 12-2, and 12-3 is provided at one end of beams 27a and 27b in the second direction.

In this example, this function corresponds to the third embodiment (see FIG. 18 and FIG. 19). For example, common electrode 18 connected to common semiconductor layer 21, and layer select transistor 15 (LST) which selects one of first, second, and third semiconductor layers 12-1, 12-2, and 12-3 are provided at one end of each of beams 27a and 27b in the second direction.

Common electrode 18 functions as a source electrode (source line side electrode) or a drain electrode (bit line side electrode) of first, second, and third memory strings Na, Nb, and Nc.

Layer select transistor 15 (LST) has been described in detail in the first to fourth embodiments, and is therefore not described here.

Between first, second, and third memory strings Na, Nb, and Nc and beams 27a and 27b, assist gate transistors 24 (AGT) are provided to select one of, for example, (four in this example) fin-type stacked layer structures constituting a memory cell array (one group comprising first, second, and third memory strings Na, Nb, and Nc).

Assist gate transistor 24 (AGT) has only to function as a switch. Thus, assist gate transistor 24 (AGT) may have the same structure as memory cell MC or may have a different structure.

For example, when assist gate transistor 24 (AGT) has the same structure as memory cell MC, assist gate transistor 24 (AGT) comprises insulating layer (gate insulating layer 25-1, recoding layer 25-2, and block insulating layer 25-3) 25, and gate electrode 26 disposed on the side of insulating layer 25 opposite to first, second, and third semiconductor layers 12-1, 12-2, and 12-3.

When assist gate transistor 24 (AGT) has a structure different from the structure of memory cell MC, assist gate transistor 24 (AGT) is a metal-insulator-semiconductor (MIS) type transistor comprising a gate insulating layer and a gate electrode.

Assist gate transistor 24 (AGT) is independently provided in, for example, each of the (four in this example) fin-type stacked layer structures constituting the memory cell array.

A material best suited to each semiconductor memory generation can be properly selected as the material that constitutes each element of the VLB. Examples of most frequently used materials are described below.

Semiconductor substrate 10 is, for example, a monocrystalline silicon substrate. Insulating layers 11 and 13 are, for example, silicon oxide layers.

First, second, and third semiconductor layers 12-1, 12-2, and 12-3 and common semiconductor layer 21 are, for example, silicon (Si) layers. First, second, and third semiconductor layers 12-1, 12-2, and 12-3 and common semiconductor layer 21 are preferably monocrystalline, but may also be amorphous or polycrystalline.

Uppermost insulating layer 14 constituting fin-type stacked layer structure has, for example, silicon oxide ($SiO_2$), silicon nitride (SiN), or a structure in which silicon oxide and silicon nitride are stacked.

Gate insulating layer 25-1 constituting memory cell MC is, for example, a silicon oxide layer. Gate insulating layer 25-1 may be silicon oxynitride, or a stacked layer structure of silicon oxide and silicon nitride. Gate insulating layer 25-1 may include silicon nanoparticles or metal ions.

Recoding layer 25-2 is, for example, a charge storage layer (e.g. $Si_3N_4$), or a variable resistance layer (e.g. a layer of a material which changes its resistance value in accordance with a voltage, a current, heat, or a magnetic field). When recoding layer 25-2 is a charge storage layer, recoding layer 25-2 may be a floating gate layer as a conductive layer instead of the insulating layer.

When recoding layer 25-2 is a charge storage layer, the charge storage layer may be made of, for example, at least one of the materials selected from the group consisting of silicon-rich SiN, $Si_xN_y$ having any composition ratio x, y of silicon and nitrogen, silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), and lanthanum aluminate ($LaAlO_3$).

The charge storage layer may include, for example, silicon nanoparticles or metal ions. The charge storage layer may otherwise be made of impurity-added polysilicon or a conductor such as a metal.

Block insulating layer 25-3 functions, for example, to prevent a leak current during writing/erasing.

Block insulating layer 25-3 is preferably made of at least one of the materials selected from the group consisting of, for example, silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), lanthanum aluminate ($LaAlO_3$), and lanthanum aluminum silicate (LaAlSiO).

Gate electrode 26 constituting memory cell MC comprises a metal silicide layer of, for example, nickel silicide (NiSi).

Gate electrode 26 may be made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

Common electrode 18 and gate electrodes 16-1 to 16-5 of layer select transistor 15 are made of a metallic material such as W, Al, or Cu.

Figure 39:
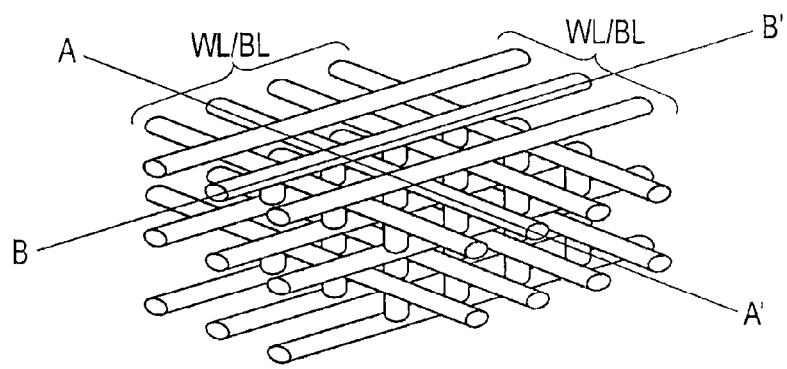
FIG. 39 is a perspective view showing a memory cell array of the memory in FIG. 38.
Figure 40:
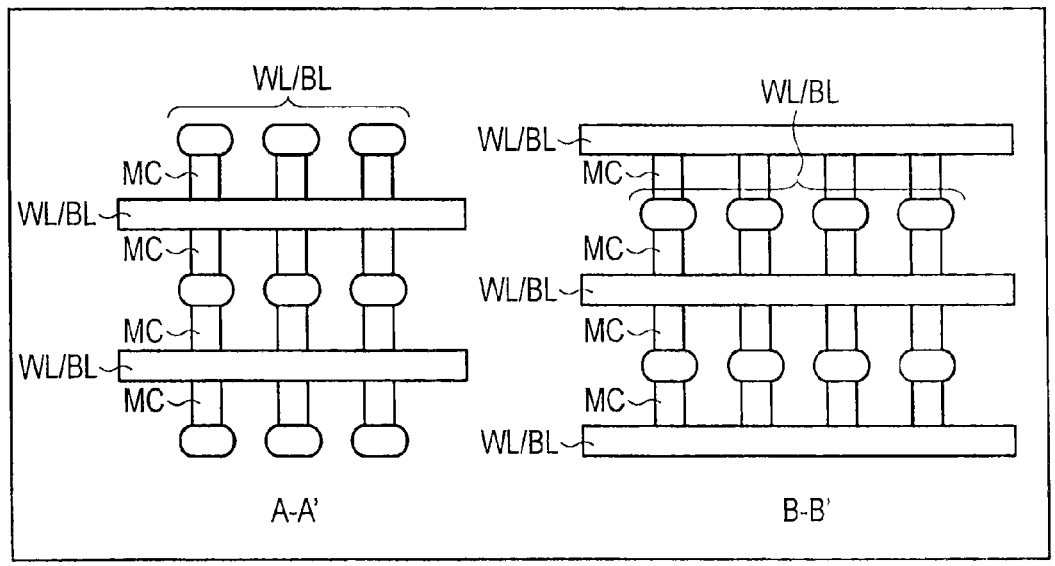
FIG. 40 is sectional views taken along line A-A' and line B-B' of an array in FIG. 39.

FIG. 38 shows a nonvolatile semiconductor memory that allows for a cross point type memory cell array. FIG. 39 shows a memory cell array in FIG. 38. FIG. 40 shows sectional views taken along the line A-A' and the line B-B' in FIG. 39.

A cross point type memory cell array can be obtained by putting two fin-type stacked layer structures (first to n-th semiconductor layers) across each other and disposing two-terminal type memory cell MC between the two fin-type stacked layer structures.

In this case, a memory cell used in a resistance change type memory such as a resistance random access memory (ReRAM), a phase change memory (PCM), or a magnetic random access memory (MRAM) can be employed as memory cell MC, as it is.

Conductive lines as word lines WL/bit lines BL that intersect with each other are provided on insulating layer 11 disposed on semiconductor substrate 10. These conductive lines comprise first, second, and third semiconductor layers 12-1, 12-2, and 12-3 stacked on insulating layer 11 disposed on semiconductor substrate 10.

In this example, the number of semiconductor layers as the conductive lines stacked on insulating layer 11 is three, but is not limited thereto. That is, the number of semiconductor layers as the conductive lines has only to be two or more.

Two-terminal type memory cell MC is disposed between word line WL and bit line BL that intersect with each other.

A memory cell used in a resistance change element which changes its resistance value in accordance with a voltage, a current, heat, or a magnetic field, for example, a resistance change type memory such as a resistive random access memory (ReRAM), a phase change memory (PCM), or a magnetic random access memory (MRAM) can be employed as memory cell MC, as it is.

Beams 27a and 27b are connected to both ends of word lines WL/bit lines BL that intersect with each other. Beams 27a and 27b have the same structure as the conductive lines serving as word lines WL/bit lines BL.

Beams 27a and 27b are added to fix word lines WL/bit lines BL and prevent the collapse of word lines WL/bit lines BL. The width of each of beams 27a and 27b is preferably greater than the width of each of word lines WL/bit lines BL.

The semiconductor device according to the embodiments, that is, a function to select one of first, second, and third semiconductor layers 12-1, 12-2, and 12-3 is provided at one end of beams 27a and 27b.

In this example, this function corresponds to the third embodiment (see FIG. 18 and FIG. 19). For example, common electrode 18 connected to common semiconductor layer 21, and layer select transistor 15 (LST) which selects one of first, second, and third semiconductor layers 12-1, 12-2, and 12-3 are provided at one end of each of beams 27a and 27b.

Common electrode 18 functions as an electrode to supply a voltage or a current to memory cells MC via first, second, and third semiconductor layers 12-1, 12-2, and 12-3.

Layer select transistor 15 (LST) has been described in detail in the first to fourth embodiments, and is therefore not described here.

Assist gate transistor 24 (AGT) is provided between word line WL/bit line BL and beams 27a and 27b. Assist gate transistor 24 (AGT) is, for example, a metal-insulator-semiconductor (MIS) type transistor comprising a gate insulating layer and a gate electrode. Assist gate transistor 24 (AGT) is not limited thereto, and has only to function as a switch.

Assist gate transistor 24 (AGT) is independently provided in, for example, each of the (four in this example) fin-type stacked layer structures constituting word lines WL/bit lines BL.

The function to select one of first, second, and third semiconductor layers 12-1, 12-2, and 12-3 is provided in both of word line WL/bit line BL that intersect with each other in this example, but may be only provided in one of word line WL/bit line BL that intersect with each other. In this case as well, the cross point type memory cell array can be normally operated.

CONCLUSION

According to the embodiments, one of the semiconductor layers stacked on the semiconductor substrate can be correctly selected even if design rules are reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate;
an insulating layer on the semiconductor substrate;
first to n-th semiconductor layers (n is a natural number equal to or more than 2) being stacked in order from a surface of the insulating layer in a first direction perpendicular to the surface of the insulating layer, the first to n-th semiconductor layers extending in a second direction parallel to the surface of the insulating layer, the first to n-th semiconductor layers being insulated from each other;
a common electrode connected to the first to n-th semiconductor layers in a first end of the second direction thereof; and
a layer select transistor which uses the first to n-th semiconductor layers as channels and which selects one of the first to n-th semiconductor layers,
wherein the layer select transistor comprises
first to m-th gate electrodes (m=n+k, k is an even number) which are arranged in order from the first end of the second direction of the first to n-th semiconductor layers toward a second end of the second direction of the first to n-th semiconductor layers, and which extend in the first direction along side surfaces of the first to n-th semiconductor layers exposing in a third direction perpendicular to the first and second directions, and
an i-th normally-on region (i is one of 1 to n) which sets channels adjacent to the i-th to (i+k)-th gate electrodes in the i-th semiconductor layer to normally-on channels, the normally-on channels which are not dependent on potentials of the i-th to (i+k)-th gate electrodes.

2. The device of claim 1,
wherein an off-potential is applied to the i-th to (i+k)-th gate electrodes to set channels adjacent to the i-th to (i+k)-th gate electrodes to off-channels, and an on-potential is applied to the other gate electrodes to set channels adjacent to the other gate electrodes to on-channels, when the i-th semiconductor layer is selected.

3. The device of claim 1,
wherein a size of the layer select transistor in the second direction is P×(n+k−1), where P is a pitch of the first to m-th gate electrodes, and n is 4 or more.

4. The device of claim 1,
wherein the first to n-th semiconductor layers are polycrystalline silicon layers, the i-th normally-on region includes arsenic, and a pitch of the first to m-th gate electrodes is 160 nm or less.

5. The device of claim 1,
wherein a low-resistance region with a resistance value lower than resistance values of the first to n-th semiconductor layers is provided in regions which are not covered by the first to m-th gate electrodes among side surfaces of the first to n-th semiconductor layers.

6. The device of claim 1,
wherein the first to n-th semiconductor layers are isolated from each other by an insulating layer or a cavity.

7. The device of claim 1, further comprising:
memory cells connected to the first to n-th semiconductor layers in the second end of the second direction thereof,
wherein each of the memory cells is a cell transistor including a charge storage layer, the cell transistor having a threshold value changing based on a charge amount in the charge storage layer, and the first to n-th semiconductor layers are used as channels of the memory cells.

8. The device of claim 1, further comprising:
memory cells connected to the first to n-th semiconductor layers in the second end of the second direction thereof,
wherein each of the memory cells is a resistance change element which has a resistance value changing based on a voltage or a current, and the first to n-th semiconductor layers are used as conductive lines to supply the voltage or the current to each of the memory cells.

9. A semiconductor device comprising:
a semiconductor substrate;
an insulating layer on the semiconductor substrate;
first to n-th semiconductor layers (n is a natural number equal to or more than 2) being stacked in order from a surface of the insulating layer in a first direction perpendicular to the surface of the insulating layer, the first to n-th semiconductor layers extending in a second direction parallel to the surface of the insulating layer, the first to n-th semiconductor layers having a stepped shape in a first end of the second direction thereof, the first to n-th semiconductor layers being insulated from each other;
first to n-th diffusion prevention layers covering the first end of the first to n-th semiconductor layers respectively;
a common semiconductor layer connected to the first to n-th semiconductor layers via the first to n-th diffusion prevention layers; and
a common electrode connected to the common semiconductor layer; and
a layer select transistor which uses the first to n-th semiconductor layers and the common semiconductor layer as channels and which selects one of the first to n-th semiconductor layers,
wherein the layer select transistor comprises
first to m-th gate electrodes (m=n+k, k is a natural number) which are arranged in order from the first end of the second direction of the first to n-th semiconductor layers toward a second end of the second direction of the first to n-th semiconductor layers, and which extend in the first direction along side surfaces of the first to n-th semiconductor layers and the common semiconductor layer exposing in a third direction perpendicular to the first and second directions, and
an i-th normally-on region (i is one of 1 to n) which sets channels adjacent to the i-th to (i+k)-th gate electrodes in the i-th semiconductor layer to normally-on channels, the normally-on channels which are not dependent on potentials of the i-th to (i+k)-th gate electrodes, and
the g-th gate electrode (g is one of 1 to n−1) is disposed between the g-th diffusion prevention layer and the (g+1)-th diffusion prevention layer, and the n-th to m-th gate electrodes are disposed closer to the second end of the first to n-th semiconductor layers than the n-th diffusion prevention layer.

10. The device of claim 9,
wherein an off-potential is applied to the to (i+k)-th gate electrodes to set channels adjacent to the i-th to (i+k)-th gate electrodes to off-channels, and an on-potential is applied to the other gate electrodes to set channels adjacent to the other gate electrodes to on-channels, when the i-th semiconductor layer is selected.

11. The device of claim 9,
wherein the diffusion prevention layer is an insulating layer with a thickness of 1 nm or less in the second direction.

12. The device of claim 9,
wherein the diffusion prevention layer is a conductive layer.

13. The device of claim 9,
wherein a size of the layer select transistor in the second direction is P×(n+k−1), where P is a pitch of the first to m-th gate electrodes, and n is 3 or more.

14. The device of claim 9,
wherein the first to n-th semiconductor layers are polycrystalline silicon layers, the i-th normally-on region includes arsenic, and a pitch of the first to m-th gate electrodes is 160 nm or less.

15. The device of claim 9,
wherein a low-resistance region with a resistance value lower than resistance values of the first to n-th semiconductor layers is provided in regions which are not covered by the first to m-th gate electrodes among side surfaces of the first to n-th semiconductor layers.

16. The device of claim 9,
wherein the first to n-th semiconductor layers are isolated from each other by an insulating layer or a cavity.

17. The device of claim 9, further comprising:
memory cells connected to the first to n-th semiconductor layers in the second end of the second direction thereof,
wherein each of the memory cells is a cell transistor including a charge storage layer, the cell transistor having a threshold value changing based on a charge amount in the charge storage layer, and the first to n-th semiconductor layers are used as channels of the memory cells.

18. The device of claim 9, further comprising:
memory cells connected to the first to n-th semiconductor layers in the second end of the second direction thereof,
wherein each of the memory cells is a resistance change element which has a resistance value changing based on a voltage or a current, and the first to n-th semiconductor layers are used as conductive lines to supply the voltage or the current to each of the memory cells.

* * * * *